(12) United States Patent
Wang et al.

(10) Patent No.: US 7,191,373 B2
(45) Date of Patent: Mar. 13, 2007

(54) METHOD AND APPARATUS FOR DIAGNOSING FAILURES IN AN INTEGRATED CIRCUIT USING DESIGN-FOR-DEBUG (DFD) TECHNIQUES

(75) Inventors: Laung-Terng (L.-T.) Wang, Sunnyvale, CA (US); Ming-Tung Chang, Hsinchu (TW); Shyh-Horng Lin, Taipei (TW); Hao-Jan Chao, Taoyuan (TW); Jaehee Lee, San Jose, CA (US); Hsin-Po Wang, Hsinchu (TW); Xiaoqing Wen, Sunnyvale, CA (US); Po-Ching Hsu, Hsinchu (TW); Shih-Chia Kao, Taipei (TW); Meng-Chyi Lin, Taoyuan (TW); Sen-Wei Tsai, Hsinchu (TW); Chi-Chan Hsu, Hsinchu (TW)

(73) Assignee: Syntest Technologies, Inc., Sunnyvale, CA (US)

( * ) Notice: Subject to any disclaimer, the term of this patent is extended or adjusted under 35 U.S.C. 154(b) by 643 days.

(21) Appl. No.: 10/086,214

(22) Filed: Feb. 27, 2002

(65) Prior Publication Data
US 2002/0138801 A1 Sep. 26, 2002

Related U.S. Application Data

(60) Provisional application No. 60/272,064, filed on Mar. 1, 2001.

(51) Int. Cl.
*G01R 31/28* (2006.01)
(52) U.S. Cl. ..................... 714/729
(58) Field of Classification Search .............. 714/724, 714/725, 726, 727, 729, 733
See application file for complete search history.

(56) References Cited

U.S. PATENT DOCUMENTS 5,488,688 A 1/1996 Gonzales et al. ............. 714/34

(Continued)

FOREIGN PATENT DOCUMENTS

EP 0 826 974 A2 3/1998

OTHER PUBLICATIONS

J. Ghosh-Dastidar et al., "A Rapid and Scalable Diagnosis Scheme for BIST Environments with a Large Number of Scan Chains," Proc., *IEEE VLSI Test Symposium*, pp. 79-85, 2000, Copy Enclosed.

(Continued)

*Primary Examiner*—James C Kerveros
(74) *Attorney, Agent, or Firm*—Jim Zegeer

(57) ABSTRACT

A method and apparatus for inserting design-for-debug (DFD) circuitries in an integrated circuit to debug or diagnose DFT modules, including scan cores, memory BIST (built-in self-test) cores, logic BIST cores, and functional cores. The invention further comprises using a DFD controller for executing a plurality of DFD commands to debug or diagnosis the DFT modules embedded with the DFD circuitries. When used alone or combined together, these DFD commands will detect or locate physical failures in the DFT modules in the integrated circuit on an evaluation board or system using a low-cost DFT debugger. A computer-aided design (CAD) method is further developed to synthesize the DFD controller and DFD circuitries according to the IEEE 1149.1 Boundary-scan Std. The DFD controller supports, but is not limited to, the following DFD commands: RUN_SCAN, RUN_MBIST, RUN_LBIST, DBG_SCAN, DBG_MBIST, DBG_LBIST, DBG_FUNCTION, SELECT, SHIFT, SHIFT_CHAIN, CAPTURE, RESET, BREAK, RUN, STEP, and STOP.

19 Claims, 22 Drawing Sheets

U.S. PATENT DOCUMENTS

| | | | |
|---|---|---|---|
| 5,491,793 A | 2/1996 | Somasundaram et al. | 714/45 |
| 5,544,311 A | 8/1996 | Harenberg et al. | 714/40 |
| 5,623,503 A * | 4/1997 | Rutkowski | 714/727 |
| 5,724,505 A | 3/1998 | Argade et al. | 714/45 |
| 5,828,824 A | 10/1998 | Swoboda | 714/25 |
| 5,828,825 A | 10/1998 | Eskandari et al. | 714/27 |
| 5,881,067 A | 3/1999 | Narayanan et al. | 714/726 |
| 6,122,762 A * | 9/2000 | Kim | 714/726 |
| 6,191,603 B1 | 2/2001 | Muradali et al. | 324/765 |
| 6,199,031 B1 | 3/2001 | Challier et al. | 703/14 |
| 6,240,377 B1 | 5/2001 | Kai et al. | 703/24 |
| 6,249,893 B1 | 6/2001 | Rajsuman et al. | 714/741 |
| 6,308,290 B1 | 10/2001 | Forlenza et al. | 714/724 |
| 6,598,192 B1 * | 7/2003 | McLaurin et al. | 714/726 |
| 6,686,759 B1 * | 2/2004 | Swamy | 324/765 |

OTHER PUBLICATIONS

Bursky: "Million-Gate Asics to Provide Systems on a Chip," Electronic Design, Penton Publishing, Cleveland, Oh, vol. 42, No. 1.

* cited by examiner

| Index | Command | Command Code | Comments |
|---|---|---|---|
| 1. | BYPASS | 0_0000; | // Prior Art – Test BYPASS. |
| 2. | SAMPLE | 0_0001; | // Prior Art – Test Sample/Preload. |
| 3. | EXTEST | 0_0010; | // Prior Art – Test EXTEST. |
| 4. | HIGHZ | 0_0011; | // Prior Art – Test High impedance. |
| 5. | CLAMP | 0_0100; | // Prior Art – Test CLAMP. |
| 6. | ID_CODE | 0_0101; | // Prior Art – Test Identification code. |
| 7. | RUN_SCAN | 0_0110; | // Test scan cores. |
| 8. | RUN_MBIST | 0_0111; | // Test memory BIST cores. |
| 9. | RUN_LBIST | 0_1000; | // Test logic BIST cores. |
| 10. | DBG_SCAN | 1_0000; | // Debug scan cores. |
| 11. | DBG_MBIST | 1_0001; | // Debug memory BIST cores. |
| 12. | DBG_LBIST | 1_0010; | // Debug logic BIST cores. |
| 13. | DBG_FUNCTION | 1_0011; | // Debug functional cores. |
| 14. | SELECT | 1_0100 10010; | // Debug MBIST/LBIST cores 4 and 1. |
| 15. | SHIFT | 1_0101 0110_1100; | // Shift data in and out of scan cells. |
| 16. | SHIFT_CHAIN | 1_0110 2 1100; | // Shift data in and out of scan chain 2. |
| 17. | CAPTURE | 1_0111; | // Capture results to all scan cells. |
| 18. | SKIP | 1_1000 1_0000_0000; | // Skip errors for 64 <cycles>. |
| 19. | RESET | 1_1001; | // Reset the circuit under test. |
| 20. | BREAK | 1_1010 1 0000_0001_0000_0000; | // Stop when 1st break bus1 = 4h'0100. |
| 21. | BREAK | 1_1010 2 1001_0011_0110; | // Stop when 2nd break bus2 = 3h'936. |
| 22. | RUN | 1_1011; | // Run system clocks forever. |
| 23. | STEP | 1_1100 1_0000_0000; | // Run system clocks 64 <cycles>. |
| 24. | STOP | 1_1101; | // Stop system clocks. |

FIG. 1

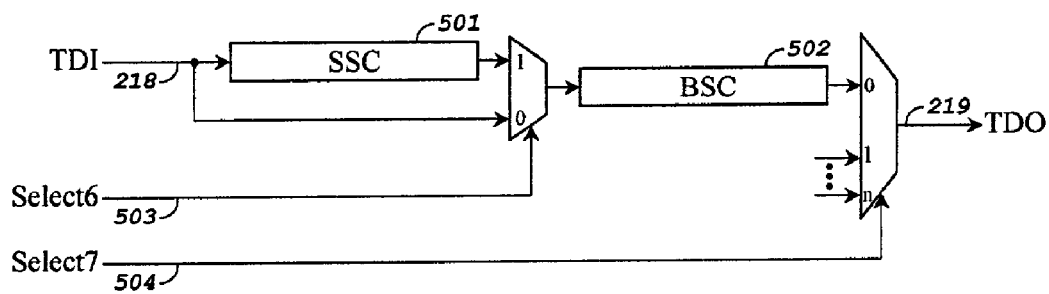
(a)
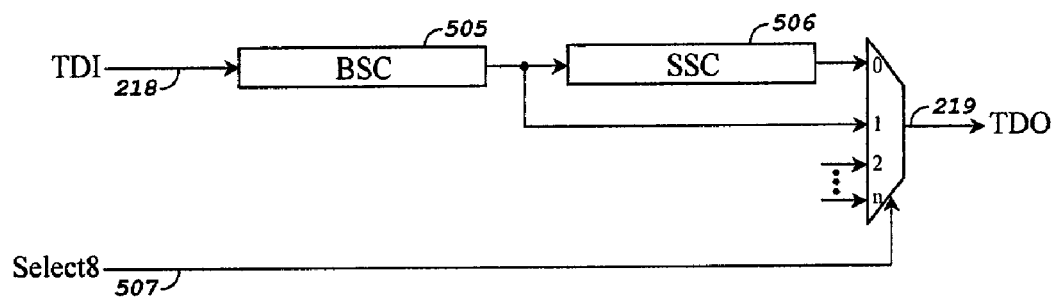
(b)
FIG. 5

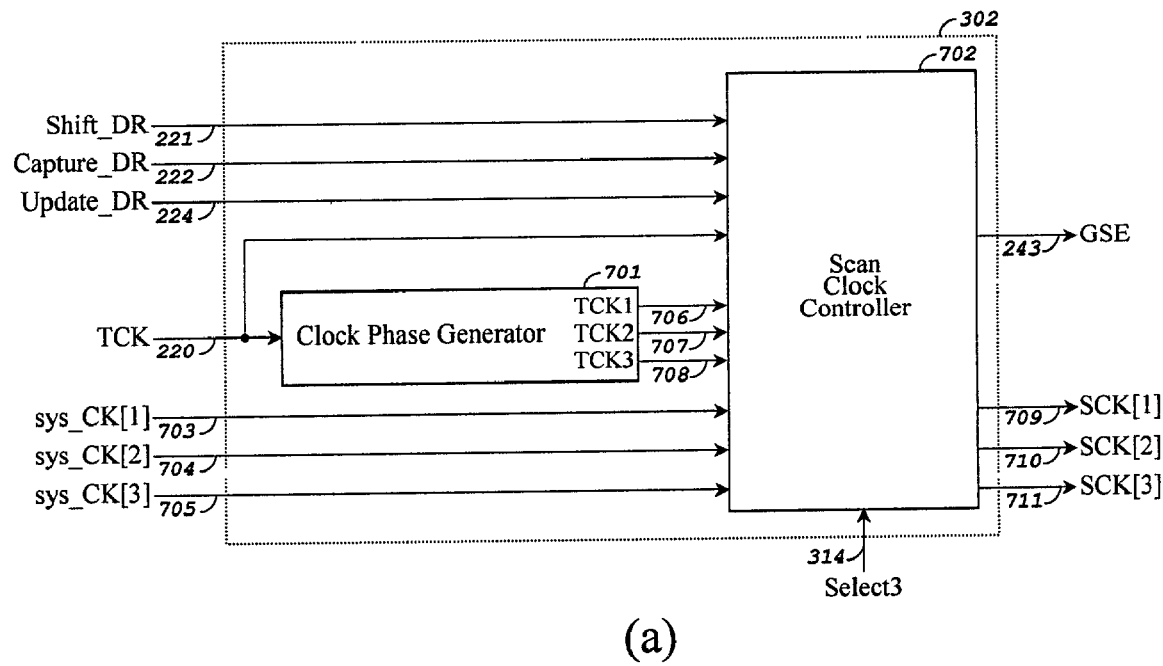
(a)
FIG. 7 Sheet-1

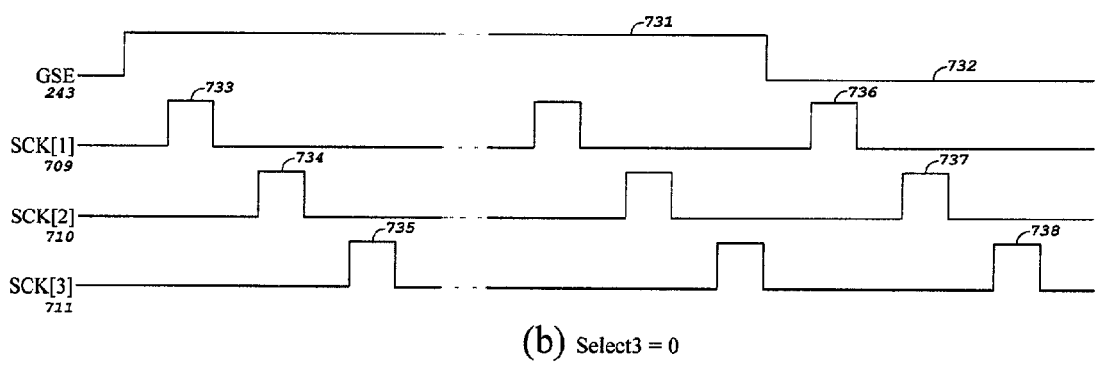
(b) Select3 = 0
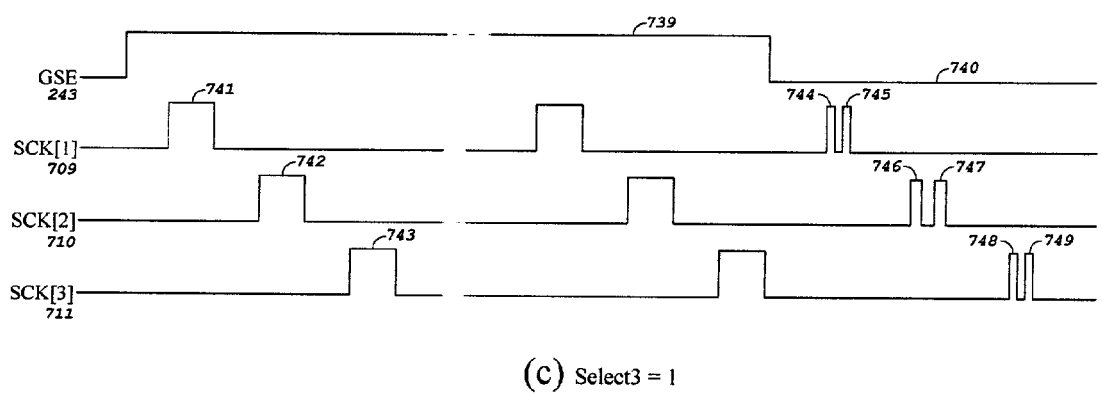
(c) Select3 = 1
FIG. 7 Sheet-2

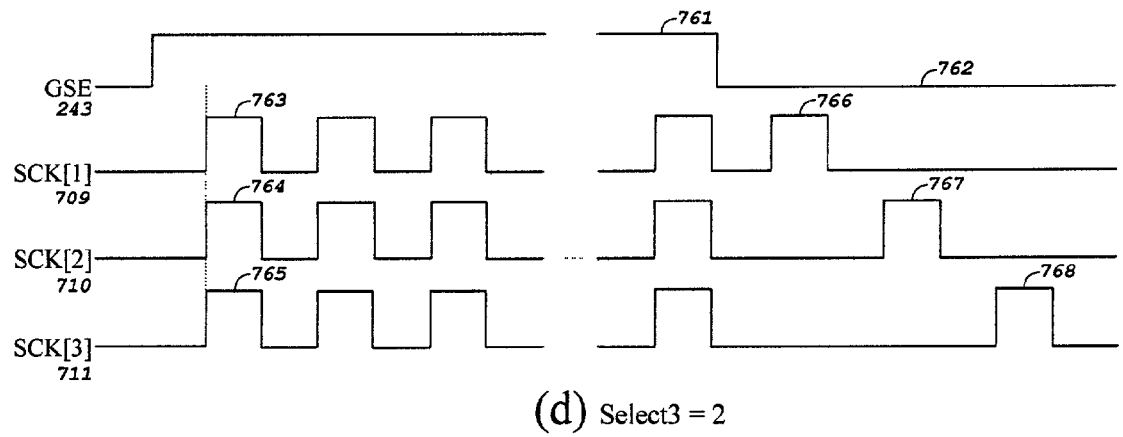
(d) Select3 = 2
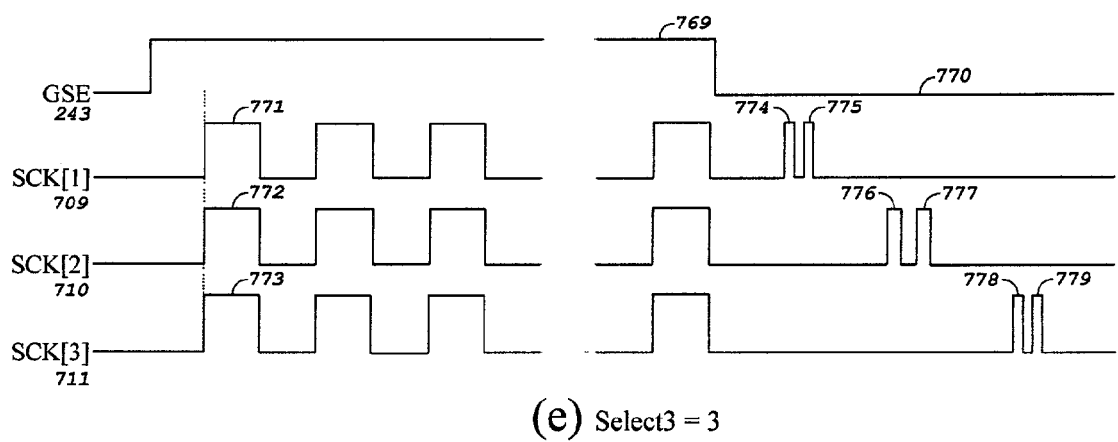
(e) Select3 = 3
FIG. 7 Sheet-3

METHOD AND APPARATUS FOR DIAGNOSING FAILURES IN AN INTEGRATED CIRCUIT USING DESIGN-FOR-DEBUG (DFD) TECHNIQUES

RELATED APPLICATION DATA

This application claims the benefit of U.S. Provisional Application No. 60/272,064 filed Mar. 1, 2001, titled "A Computer-Aided Design System for Automatic Synthesis of Design for Debug Circuitry with Boundary-Scan in Scan-Based Integrated Circuits", which is hereby incorporated by reference.

TECHNICAL FIELD

The present invention generally relates to the testing, debugging, and diagnosis of integrated circuits embedded with design-for-test (DFT) and design-for-debug (DFD) techniques. Specifically, the present invention relates to prototype debug or fault diagnosis using DFT and DFD techniques to debug or diagnose physical failures in an integrated circuit.

BACKGROUND

Recent advance in semiconductor manufacturing and design-for-test (DFT) technology has produced very high-quality integrated circuits containing millions of gates. The most popular DFT techniques used to-date in an integrated circuit include scan, memory BIST (built-in self-test), logic BIST, and boundary-scan. See the books written by Abromovici et al. (1990), Nadeau-Dostie (2000), and Crouch (2000). These DFT techniques have made an integrated circuit more testable and yielded lower test costs than using ad hoc functional test techniques. However, it is becoming more and more difficult to guarantee that the integrated circuit, even embedded with DFT circuitries, will function the first time.

Prior-art approaches to prototype debug or diagnosis center on using an ATE (automatic test equipment) or an electronic-beam (E-beam) tester to debug or diagnose physical failures in the integrated circuit. This process is tedious and time-consuming, as it requires collaborative efforts between design engineers and test engineers, and heavily relies on the tester's availability.

While these approaches can eventually identify physical failures in the integrated circuit, it is still highly possible that the chip won't work on an evaluation board or system due to undiscovered timing errors on the ATE or missing functional specification. Consequently, design engineers must embed diagnostics features in the integrated circuit and debug the circuit's functional errors on an evaluation board or system separately. See U.S. Pat. Nos. 5,488,688 (1996), 5,491,793 (1996), 5,544,311 (1996), 5,724,505 (1998), 5,828,824 (1998), 5,828,825 (1998), and 6,249,893 (2001). This missing link between DFT verification on an ATE and functional verification on an evaluation board or system could potentially miss the chip's time-to-market or time-to-volume window.

Thus, there is a need to provide an improved method and apparatus for debugging or diagnosing DFT and functional errors in an integrated circuit placed on an evaluation board or system using a low-cost DFT debugger. There is also a need to develop such a computer-aided design (CAD) method for automatically synthesizing the design-for-debug (DFD) circuitries in the integrated circuit.

SUMMARY

Accordingly, a primary objective of the present invention is to provide such an improved method and apparatus for inserting design-for-debug (DFD) circuitries in an integrated circuit to facilitate prototype debug and diagnosis. Another objective of the present invention is to develop such a computer-aided design (CAD) method for automatically synthesizing the DFD circuitries in the integrated circuit.

In the present invention, we assume that the integrated circuit under test comprises a plurality of design-for-test (DFT) modules, including scan cores, memory BIST (built-in self-test) cores, logic BIST cores, and functional cores. The method and apparatus of the present invention will allow designers to perform DFT and functional debug or diagnosis using a low-cost DFT debugger on a desktop, while leaving the most difficult problems to an ATE (automatic test equipment) or electronic-beam (E-beam) tester for final debug or diagnosis. In the present invention, the method or apparatus is selectively implemented or placed inside or external to the integrated circuit under test.

In one aspect of the present invention, the method provides a basic set of boundary-scan controlled DFD commands to test, debug, or diagnose the above-mentioned DFT modules. (Please refer to FIG. 1 in the DETAILED DESCRIPTION OF THE DRAWINGS section for further descriptions). These basic DFD commands, when used alone or combined together, will allow designers to debug DFT and functional errors on an evaluation board or system using a low-cost, boundary-scan controlled DFT debugger.

In another aspect of the present invention, an apparatus is constructed according to the method. The apparatus comprises a DFD controller and a plurality of DFD circuitries for inserting into the above-mentioned DFT modules. The DFD controller uses an IEEE 1149.1-compliant boundary-scan test access port (TAP) to control the DFD circuitries. See the IEEE 1149.1 Boundary-scan Std. (1993) for more detailed descriptions. Since the IEEE Boundary-scan Standard is employed, there is no need to add any additional input or output pin to the circuit under test, other than the 4 to 5 dedicated boundary-scan pins required by the Standard: TDI (Test Data In), TDO (Test Data Out), TMS (Test Mode Select), TCK (Test Clock), and the optional TRSTB (Test Reset).

The aspects and features of the present invention when combined will allow design engineers to achieve the following goals:

1. They can debug or diagnose an integrated circuit placed on an evaluation board or system alone, and only ask test engineers for assistance in solving the most difficult problems on an ATE or E-beam tester.
2. They can use only the boundary-scan pins and system clocks to debug or diagnose suspicious DFT modules, including scan cores, memory BIST cores, logic BIST cores, and functional cores, on a low-cost DFT debugger.
3. They can perform scan diagnosis to locate faulty scan chains and scan cells using all scan chains and scan clocks already built in the integrated circuit on a DFT debugger.
4. They can perform memory BIST diagnosis to locate all memory errors arising from faults, including memory defects or data retention faults, on a DFT debugger.
5. They can perform logic BIST diagnosis to locate all multiple signature errors as well as their respective faulty scan chains and scan cells on a DFT debugger.

6. They can perform functional diagnosis to locate functional errors arising from faults, including delay faults or memory read/write faults, on a DFT debugger.
7. The method and apparatus of the present invention are applicable for debugging or diagnosing other types of DFT modules, including memory scan cores, ROM (read-only memory) BIST cores, PLL (phase-locked loop) BIST cores, DAC (digital-to-analog converter) BIST cores, ADC (analog-to-digital converter) BIST cores, and other BIST cores generating error signals or cycle-end signals.

In order to debug or diagnose scan cores or functional cores in an integrated circuit, the present invention first comprises using a DFD selector to indicate which scan cores or functional cores shall be diagnosed simultaneously. When one particular bit in the DFD selector is set to logic value 1, a scan core or functional core is chosen for diagnosis. The DFD selector further includes additional bits, when desired, in each scan core or functional core to diagnose stuck-type faults, non-stuck-type delay faults, or memory read/write faults. The DFD selector is controlled by TCK and is a shift register with its scan data input and scan data output connected to TDI and TDO, respectively.

The method of the present invention further comprises connecting all scan cells within all scan cores and functional cores to TDI and TDO directly. There are three approaches to implementing the method. The first approach is to stitch all scan cells within all multiple scan chains together as one serial scan chain with its scan data input and scan data output connected to TDI and TDO, respectively. The second approach is to stitch these scan cells together as one serial scan chain and insert it before or after the IEEE 1149.1 boundary-scan chain. The final approach is to stitch only those scan cells sharing the same scan clock together as one single scan chain, called grouped scan chain, with its scan data input and scan data output connected to TDI and TDO, respectively.

A scan connector comprising a plurality of multiplexers and lock-up D latches (or D flip-flops) is used in the present invention to construct the serial scan chain or grouped scan chain according to the chosen approach.

In principle, functional cores are scan cores. The only difference is functional cores are controlled by system clocks, while scan cores are controlled by reconfigured system clocks, called scan clocks.

In order to debug or diagnose scan cores, the present invention further comprises using a scan clock generator for generating a plurality of non-overlapping TCK clocks or a plurality of non-overlapping system clocks, for connecting to scan clocks, to perform the shift and capture operations.

There are a number of advantages with this approach. First, it allows designers to shift data in and out of all scan cells in all scan chains for diagnosis via TDI and TDO only. Second, it reduces peak power consumption as well as average power dissipation since only scan cells associated with one scan clock will change states during each shift operation. Third, there won't be any clock skew problems during each capture operation. Finally, when grouped scan chains are used, it will allow diagnosis being performed on one grouped scan chain, thus, increasing the scan diagnosis resolution and accuracy.

There are also a number of advantages with this approach. First, the non-overlapping TCK clocks are used to debug or diagnose any stuck-type faults, including stuck-at, bridging, and IDDQ (IDD quiescent current) faults, in scan cores. Second, the non-overlapping system clocks are used to debug or diagnose any non-stuck-type delay faults, including transition (gate-delay) faults, path-delay faults, memory read/write faults, and multiple-cycle delay faults. Finally, scan patterns developed for production testing can be re-used immediately for diagnosis, thus, allowing designers to use a low-cost DFT debugger to duplicate the same problems on an evaluation board or system as appeared on an ATE.

In order to debug or diagnose functional cores, the present invention further comprises using a plurality of DFD commands, including RESET, BREAK, RUN, STEP, and STOP, to control the operation of the system clocks. When a functional error is found, the failure data can be shifted out for diagnosis using the serial scan chain or grouped scan chains already built in the scan cores.

If peak power consumption and average power dissipation are not an issue, one can connect TCK to the serial scan chain during the shift operation and only connect non-overlapping TCK clocks or non-overlapping system clocks to all scan clocks during the capture operation. This can further reduce shift time and diagnosis time when a serial scan chain is deployed for diagnosis.

In order to debug or diagnose memory BIST and logic BIST cores in an integrated circuit, the method of the present invention first comprises using a DFD selector to indicate which memory BIST cores or logic BIST cores shall be diagnosed simultaneously. When one particular bit of the DFD selector is set to logic value 1, a memory BIST core or logic BIST core is chosen for diagnosis. The DFD selector further includes additional bits, when desired, in each memory BIST or logic BIST core to diagnose single or multiple errors arising from faults, including memory faults, data retention faults, stuck-type faults, or non-stuck-type delay faults.

There are a number of advantages with this approach. First, it allows design engineers to enable or disable diagnosis of selected BIST cores at any time. Second, it allows design engineers to skip the failed BIST cores and focus on diagnosis of other BIST cores. Finally, it allows test engineers to manage power consumption during production testing by selectively choosing BIST cores for concurrent testing.

In order to debug or diagnose memory BIST (MBIST) failures, the method of the present invention further comprises using an asynchronous sampling approach to shift out the contents of the MBIST debug register for diagnosis. The asynchronous sampling approach indicates that the contents of the MBIST debug register are sampled periodically and shifted out for analysis whether or not an error is found. The MBIST debug register is a separate shift register which stores selected MBIST finish signal, status codes, memory address, output data, error memory index, error signal, and other selected registers and signals in the memory BIST core. It is controlled by TCK and its scan data input and scan data output are directly or indirectly connected to TDI and TDO, respectively.

Whenever a memory BIST operation in the memory BIST controller detects an error, the memory BIST controller in the memory BIST core will output an error signal, halt the BIST operation, and begin to wait for a continue signal to resume its BIST operation and reset the error signal. To reduce diagnosis time, the present invention further comprises using a skip register for storing the number of MBIST clock cycles or errors the designer wishes to skip during diagnosis. In this case, the error signal will be issued only after the memory BIST controller has passed the number of MBIST clock cycles or errors.

While the memory BIST controller is performing the memory BIST operation, the MBIST data is captured (or sampled) periodically into the MBIST debug register and shifted out for diagnosis. During or after shifting MBIST data out for diagnosis, the TAP controller via the memory BIST DFD circuitry will issue the continue signal to resume the memory BIST operation. The capture and shift operations are repeated periodically until memory BIST diagnosis is done.

In order to debug or diagnose logic BIST (LBIST) failures, the method of the present invention further comprises using a synchronous sampling approach to shift in and shift out the contents of the seed register for diagnosis. The synchronous sampling approach indicates that the contents of the seed register must be sampled only after a cycle-end signal is found. If there are many BIST operations to be performed concurrently, the TAP controller must wait until all cycle-end signals have been generated. The seed register stores selected LBIST data including the pseudorandom pattern generator (PRPG), cycle counter, multiple-input signature register (MISR), scan-chain mask, cycle-mask start index, cycle-mask stop index, and other selected registers and signals. It is reconfigured from current data registers and signals as a shift register, but it can be a separate LBIST debug register. If a LBIST debug register is used, its clock will be connected to TCK directly. There won't be any need to switch the clock between TCK and the LBIST clock, as in the seed register case.

Whenever a logic BIST operation in the logic BIST controller completes one or more selected LBIST clock cycles, the logic BIST controller in the logic BIST core will output a cycle-end signal, halt the BIST operation, and begin to wait for a continue signal to resume its BIST operation and to reset the cycle-end signal. The LBIST data is captured (or sampled) periodically into the seed register and shifted out for diagnosis. After shifting BIST data out for diagnosis, the TAP controller via the logic BIST DFD circuitry will issue the continue signal to resume the logic BIST operation. The capture and shift operations are repeated periodically until logic BIST diagnosis is done.

There are a number of advantages of using this seed register for logic BIST diagnosis. First, it can locate multiple signature errors. Conventional approaches without the ability of shifting selected seed to the failed BIST cycle could only find the first signature error. Second, it can further locate multiple errors in scan chains and scan cells. Finally, linear search or binary search can be employed alone or combined together to reduce diagnosis time.

The present invention further comprises using a hybrid linear search and binary search method to locate all signature errors in each MISR. When a signature error is found, all scan cells in the logic BIST core can be shifted out for off-chip diagnosis. The designers can also use on-chip diagnostics features to locate faulty scan chains and scan cells. See U.S. Patent Nos. 5,881,067 (1999) and 6,308,290 (2001), and the paper co-authored by Ghosh-Dastidar et al. (2000).

One major difference between memory BIST diagnosis and logic BIST diagnosis of the present invention is that the former uses an additional MBIST debug register to capture the BIST data, the latter reconfigures existing data registers and signals as a shift register, called seed register, to store the BIST data. Both methods sample the BIST data periodically, however, the former uses an asynchronous approach, while the latter uses a synchronous approach. Thus, it is important to ensure that each TCK sampling period be longer than one memory BIST or logic BIST cycle in order to reduce shift data volume for diagnosis. In addition, for logic BIST diagnosis, one should control the TCK sampling period very carefully in order not to confuse the logic BIST operation.

It should be appreciated that the present invention is also applicable for debugging or diagnosis of any other digital or analog BIST cores, including memory scan corers, ROM BIST cores, PLL BIST cores, DAC BIST cores, ADC BIST cores, and other BIST cores generating error signals or cycle-end signals. In addition, boundary-scan controlled commands can be added to, combined together, or deleted from the disclosed set of DFD commands to facilitate debug and diagnosis of above digital and analog cores and are thus also covered by the present invention, when such DFD techniques are used.

BRIEF DESCRIPTION OF THE DRAWINGS

The above and other objects, advantages and features of the invention will become more apparent when considered with the following specification and accompanying drawings wherein:

FIG. 1 lists a plurality of boundary-scan controlled commands, including 14 basic design-for-debug (DFD) commands of one embodiment of the present invention, for testing, debugging or diagnosing scan cores, memory BIST cores, logic BIST cores, and functional cores in an integrated circuit;

FIG. 5 shows a scan connector of a second embodiment of the present invention to stitch multiple scan chains to one serial scan chain for diagnosing scan cores, logic BIST cores, or functional cores;

FIG. 7 shows a scan clock generator of one embodiment of the present invention to generate scan clocks for diagnosing scan cores;

DETAILED DESCRIPTION OF THE INVENTION

Figure 2:
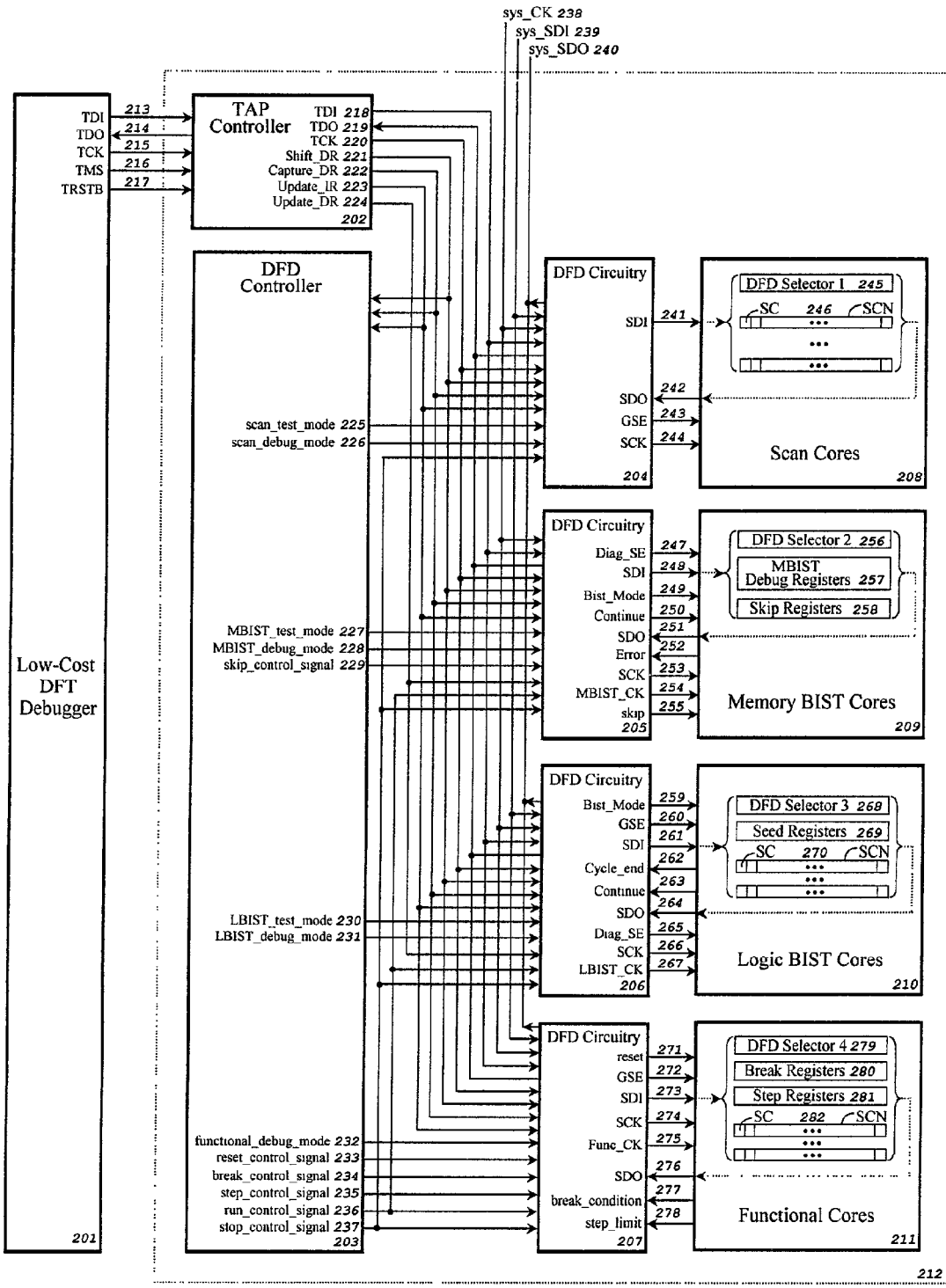
FIG. 2 shows a DFD controller of one embodiment of the present invention to support the basic DFD commands listed in FIG. 1.

The following description is presently contemplated as the best mode of carrying out the present invention. This description is not to be taken in a limiting sense but is made merely for the purpose of describing the principles of the invention. The scope of the invention should be determined by referring to the appended claims.

FIG. 1 lists a plurality of boundary-scan controlled commands to test, debug, or diagnose DFT modules in an integrated circuit. The DFT modules include scan cores, memory BIST cores, logic BIST cores, and functional cores.

The first 6 commands, from BYPASS to ID_CODE, are prior-art JTAG (joint-task action group) instructions to test the boundary-scan operations. The next 3 commands, from RUN_SCAN to RUN_LBIST, are conventional DFT instructions to test these DFT modules. The last 14 commands, comprising 4 instructions, from DBG_SCAN to DBG_FUNCTION, and 10 commands from SELECT to STOP, are all referred to as DFD commands of the present invention to debug or diagnose these DFT modules.

In more specific, an instruction, such as DBG_SCAN, sets a scan debug mode to logic value 1, while a command, such as SELECT or STOP, will generate a control signal and won't reset said scan debug mode to logic value 0. These DFD commands, when used alone or combined together with other JTAG and DFT instructions, will facilitate debug or diagnosis of the DFT modules and allow designers to debug or diagnose functional errors on an evaluation board or system using a low-cost DFT debugger.

The IEEE 1149.1 boundary-scan Std. supports 4 dedicated pins, TDI (Test Data In), TDO (Test Data Out), TMS (Test Mode Select), and TCK (Test Clock), as well as one optional input pin, TRSTB (Test Reset).

The function of each basic DFD command of the present invention is listed and described below:

1. DFD command—DBG_SCAN

The command will inform the DFD controller which scan cores are to be debugged or diagnosed. A scan debug mode is set to logic value 1 when the command is issued. The scan debug mode will remain at logic value 1 until one issues any other JTAG instruction, including DBG_MBIST, DBG_LBIST, or DBG_FUNCTION. By that time, the scan debug mode will be automatically reset to logic value 0.

2. DFD command—DBG_MBIST

The command will inform the DFD controller which memory BIST cores are to be debugged or diagnosed. An MBIST debug mode is set to logic value 1 when the command is issued. The MBIST debug mode will remain at logic value 1 until one issues any other JTAG instruction, including DBG_SCAN, DBG_LBIST, or DBG_FUNCTION. By that time, the MBIST debug mode will be automatically reset to logic value 0.

3. DFD command—DBG_LBIST

The command will inform the DFD controller which logic BIST cores are to be debugged or diagnosed. A LBIST debug mode is set to logic value 1 when the command is issued. The LBIST debug mode will remain at logic value 1 until one issues any other JTAG instruction, including DBG_SCAN, DBG_MBIST, or DBG_FUNCTION. By that time, the LBIST debug mode will be automatically reset to logic value 0.

4. DFD command—DBG_FUNCTION

The command will inform the DFD controller which functional cores are to be debugged or diagnosed. A functional debug mode is set to logic value 1 when the command is issued. The functional debug mode will remain at logic value 1 until one issues any other JTAG instruction, including DBG_SCAN, DBG_MBIST, or DBG_LBIST. By that time, the functional debug mode will be automatically reset to logic value 0.

5. DFD command—SELECT <cores>

The command will allow designers to select or skip desired DFT modules, <cores>, for diagnosis. Additional fault types, including stuck-at, transition (gate-delay), path-delay faults, multiple-cycle delay faults, IDDQ faults, data retention faults, and memory read/write faults, can be stored in the DFT selector.

6. DFD command—SHIFT <pattern>

The command will automatically shift in the specified <pattern> via TDI to selected scan cells and shifting out the contents of selected scan cells via TDO for diagnosis. Depending on the DFD debug mode, specific scan cells in selected serial/grouped scan chain, MBIST debug register, or LBIST seed register are selected.

7. DFD command—SHIFT_CHAIN <index> <pattern>

The command will automatically shift in this specified <pattern> via TDI and load it into the scan cells of the grouped scan chain <index>. This command is useful for scan diagnosis, logic BIST diagnosis, and functional diagnosis when it is required to shift data in and out of all scan cells within the selected scan chain <index>.

8. DFD command—CAPTURE

The command will capture the results and load it into the scan cells in selected scan cores, memory BIST cores, or logic BIST cores.

9. DFD command—SKIP <cycles>/SKIP <number of errors>

The command will allow the integrated circuit to skip one or more <cycles> or <number of errors> using memory BIST clocks. A skip register is required to store said <cycles> or <number of errors> in each memory BIST core.

10. DFD command—RESET

The command will initialize the functional cores to a predetermined state. A reset control signal is set to logic value 1 when the command is issued.

11. DFD command—BREAK <index> <condition>

The command will stop the system clocks immediately after the break <index> hits the break <condition>. The break <index> indicates which signal or bus is to be monitored in the functional core. The break <condition> indicates when to stop system clocks. There can be as many BREAK commands as required to monitor the internal states. Since this command is specified before issuing a RUN command, there will be no TCK clock delays. A set of break registers is required to store the BREAK commands. A break control signal is set to logic value 1 when the command is issued, and a break condition signal is set to logic value 1 when the break register <condition> is met. Both signals get reset to logic value 0 when a TAP controller signal, Update_IR, arrives.

12. DFD command—RUN

The command will allow the integrated circuit to run forever during each DFD debug mode. A run control signal is set to logic value 1 when the command is issued.

13. DFD command—STEP <cycles>

The command will allow the integrated circuit to run one or more <cycles> using system clocks. A step counter is required to store said <cycles> limit. A step control signal is set to logic value 1 when the command is issued, and a step limit signal is set to logic value 1 when the step counter reaches its limit.

14. DFD command—STOP

The command will stop the integrated circuit from running. Since the command is under TCK control, there will be a few clock cycle delays before the system clocks can stop. A stop control signal is set to logic value 1 to temporarily suspend the operation of the selected scan core, memory BIST core, logic BIST core, or functional core.

FIG. 2 shows a DFD controller 203 of one embodiment of the present invention to support the basic DFD commands listed in FIG. 1. The circuit under debug 212 consists of scan cores 208, memory BIST cores 209, logic BIST cores 210, or functional cores 211 or a mixture of these types of cores. Each type of core is associated with a dedicated DFD circuitry 204 to 207. These DFD circuitries 204 to 207 are controlled by the central DFD controller 203, which is in turn controlled by the TAP controller 202. The control and data interface between the circuit under debug 212 and the low-cost DFT debugger 201 is a standard JTAG interface, composed of TDI 213, TDO 214, TCK 215, TMS 216, and optionally TRSTB 217, as well as the system clocks sys_CK 238.

Figure 6:
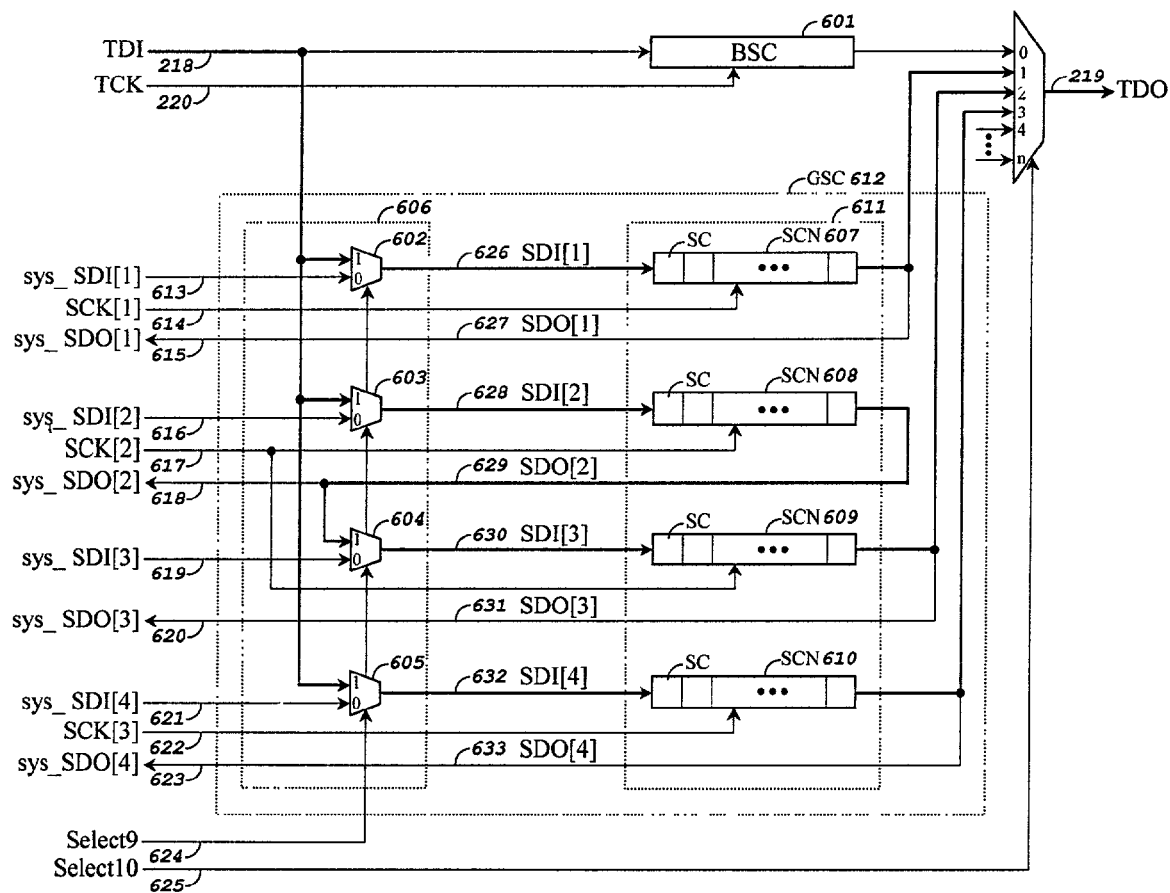
FIG. 6 shows a scan connector of a third embodiment of the present invention to stitch multiple scan chains to a plurality of grouped scan chains for diagnosing scan cores, logic BIST cores, or functional cores.

For scan cores 208, a shift register 245 named DFD Selector 1 is used to specify which scan cores to be debugged and which type of faults to be targeted. The details of DFD Selector 1 245 is given in FIG. 3. In addition, all scan cells SC within all scan cores 208 should be put into scan chains SCN 246. In debug mode, these scan chains SCN 246 are stitched to form either one serial scan chain or multiple grouped scan chains. These serial or grouped scan chains can be accessed through TDI 213 and TDO 214. The details for scan chain stitching with a scan connector are illustrated in FIG. 4, FIG. 5, and FIG. 6. The operation of scan cores 208 is controlled by the DFD controller 203 via the dedicated DFD circuitry 204.

For memory BIST cores 209, a shift register 256 named DFD Selector 2 is used to specify which memory BIST cores to be debugged and which type of faults to be targeted. The details of DFD Selector 2 is given in FIG. 8. In addition, there are MBIST debug registers 257, which are used to capture and shift out the values of various internal signals in memory BIST cores 209 for the debug purpose. Furthermore, there are skip registers 258, one for each memory BIST core. A skip register 258 is used for storing a predetermined number of MBIST clock cycles or errors to be skipped during the process of debugging a memory BIST core. The operation of memory BIST cores 209 is controlled by the DFD controller 203 via the dedicated DFD circuitry 205.

For logic BIST cores 210, a shift register 268 named DFD Selector 3 is used to specify which logic BIST cores to be debugged and which type of faults to be targeted. The details of DFD Selector 3 is given in FIG. 10. In addition, there are seed registers 269, which can be reconfigured from existing registers, including PRPGs and MISRs, or be formed by additional registers used to hold the values of various internal signals for the debug purpose. Furthermore, all scan cells SC within all logic BIST cores 210 should be put into scan chains SCN 270. In debug mode, the scan chains SCN 270 are stitched to form either one serial scan chain or multiple grouped scan chains. These serial or grouped scan chains can be accessed through TDI 213 and TDO 214. The details for scan chain stitching with a scan connector are illustrated in FIG. 4, FIG. 5, and FIG. 6. The operation of logic BIST cores 210 is controlled by the DFD controller 203 via the dedicated DFD circuitry 206.

For functional cores 211, a shift register 279 named DFD Selector 4 is used to specify which functional cores to be debugged and which type of faults to be targeted. The details of DFD Selector 4 is given in FIG. 13. In addition, there are break registers 280 and step counters 281, which contain break conditions and step limits, respectively. Furthermore, all scan cells SC within all functional cores 211 should be put into scan chains SCN 282. In debug mode, the scan chains SCN 282 are stitched to form either one serial scan chain or multiple grouped scan chains. These serial or grouped scan chains can be accessed through TDI 213 and TDO 214. The details for scan chain stitching with a scan connector are illustrated in FIG. 4, FIG. 5, and FIG. 6. The operation of functional cores 211 is controlled by the DFD controller 203 via the dedicated DFD circuitry 207.

The DFD controller 203 generates control signals based on 14 DFD commands, including 4 instructions from DBG_SCAN to DBG_FUNCTION, and 10 commands from SELECT to STOP, as listed in FIG. 1. A DFD command is applied from the low-cost DFT debugger 201 via the TAP controller 202 and is converted into proper control values, including DFD test modes 225, 227, and 230, DFD debug modes 226, 228, 231, and 232, and control signals 229, 233, 234, 235, 236, and 237. Any instruction, from DBG_SCAN to DBG_FUNCTION, sets its corresponding debug mode signal to logic value 1. For example, applying the DBG_SCAN instruction will set the scan_debug_mode signal 226 to logic value 1. However, any command, from SELECT to STOP, only generates a corresponding control signal and cannot reset any debug mode signal to logic value 0. The 14 DFD commands, when used alone or combined together with other JTAG and DFT instructions, will facilitate debug or diagnosis of various cores using a low-cost DFT debugger.

Figure 3:
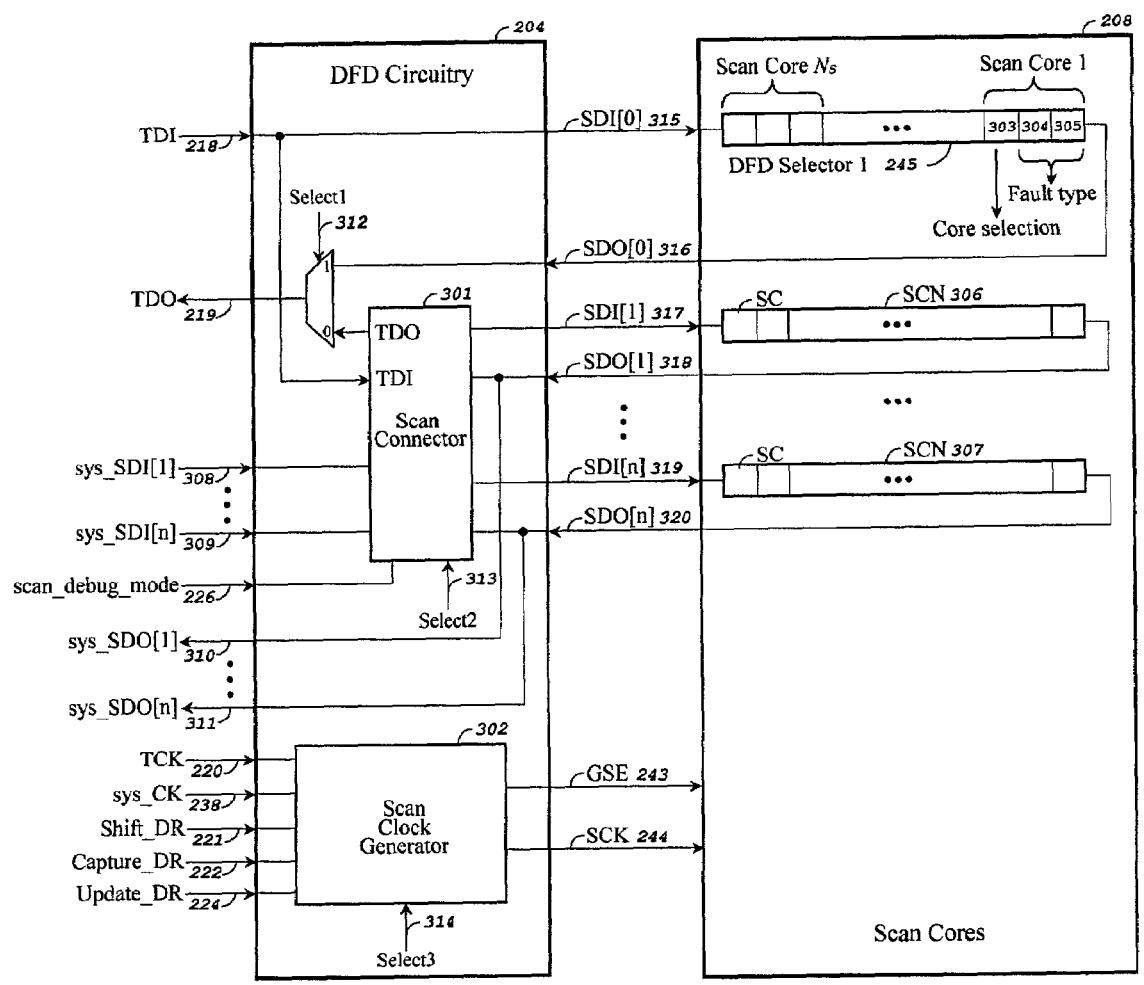
FIG. 3 shows a DFD circuitry of one embodiment of the present invention to debug or diagnose scan cores.
Figure 4:
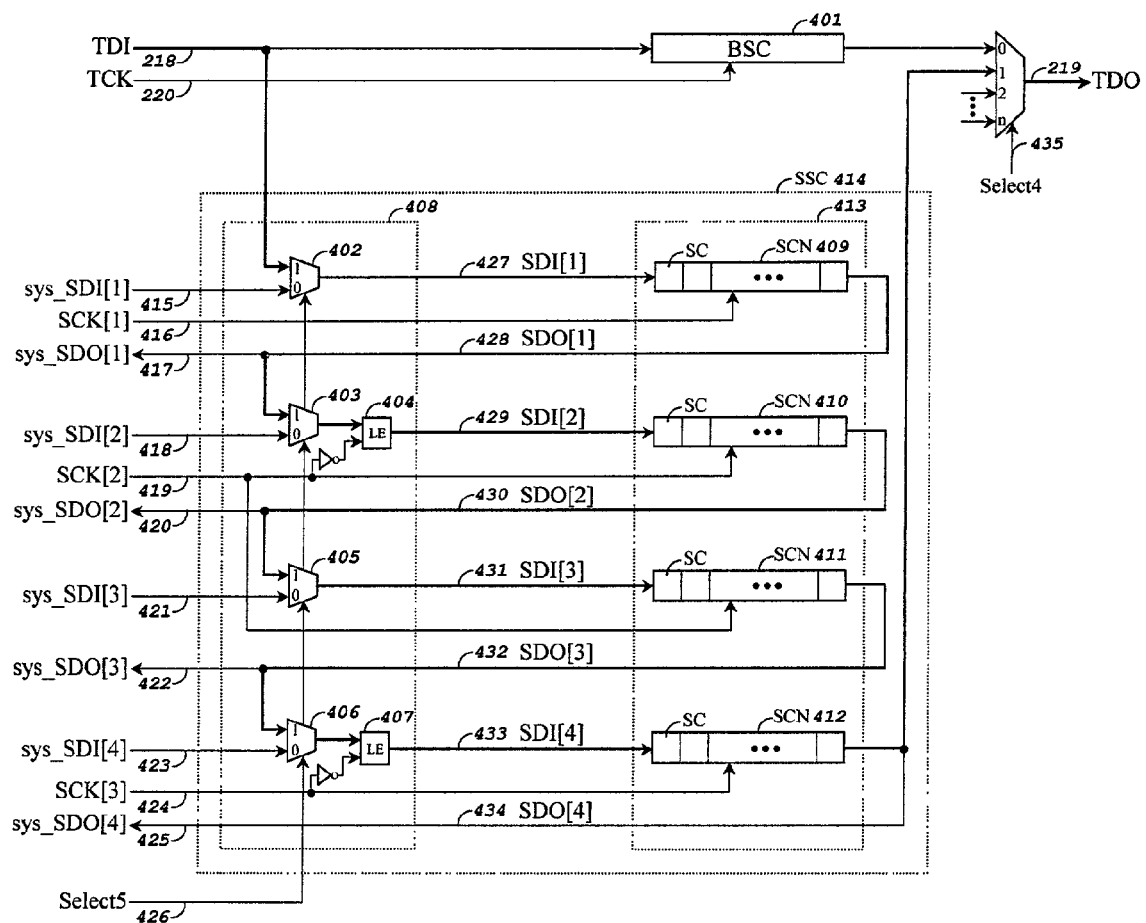
FIG. 4 shows a scan connector of a first embodiment of the present invention to stitch multiple scan chains to one serial scan chain for diagnosing scan cores, logic BIST cores, or functional cores.

FIG. 3 shows a DFD circuitry 204 of one embodiment of the present invention to debug or diagnose scan cores 208.

In the scan cores 208, DFD Selector 1 is a shift register 245 of which 2 or more bits are assigned to each scan core to indicate whether the scan core will be diagnosed and what type of faults, including stuck-at, bridging, IDDQ, transition (gate-delay), path-delay, memory read/write, or multiple-cycle delay faults, shall be targeted. For example, for the first scan core Scan Core 1, the bit 303 indicates if this core will be diagnosed while the bits 304 and 305 indicate what type of faults should be targeted.

In addition, all scan cells SC within all scan cores 208 should be put into scan chains SCN 306 to 307, which are connected to the scan connector 301. In debug mode as indicated by the scan_debug_mode signal 226, the scan chains SCN 306 to 307 are stitched into either one serial scan chain or multiple grouped scan chains with a scan connector illustrated in FIG. 4, FIG. 5, and FIG. 6. As a result, if the Select1 312 and Select2 313 signals are properly generated, the DFT Selector 1 245, a serial scan chain, or any of grouped scan chains can be placed between TDI 218 and TDO 219 according to various test and debug requirements.

Furthermore, the DFD Circuitry 204 includes a scan clock generator 302, whose structural details and sample output waveforms are shown in FIG. 7.

FIG. 4 shows a scan connector 408 of a first embodiment of the present invention to stitch multiple scan chains SCN 409 to 412 to one serial scan chain SSC 414 for the purpose of diagnosing scan cores 208, logic BIST cores 210, or functional cores 211.

The scan chain SCN 409 is driven by the scan clock SCK[1] 416, the scan chains SCN 410 and 411 are in the same clock domain driven by the scan clock SCK[2] 419, and the scan chain SCN 412 is driven by the scan clock SCK[3] 424. With four multiplexers 402 to 406 in the scan connector 408, the four scan chains 409 to 412 are stitched into one serial scan chain SSC 414. The Select5 426 signal should be generated so that all scan chains SCN 409 to 412 get input data from TDI 218 in debug mode and from the external scan data inputs sys_SDI[1] 415, sys_SDI[2] 418, sys_SDI[3] 421, and sys_SDI[4] 423 in test mode. The Select4 435 signal should be generated so that the boundary-scan chain BSC 401, the serial scan chain SSC 414, or other registers can be properly placed between TDI 218 and TDO 219 according to various test and debug requirements.

Note that two inverters and two lock-up elements (each comprising a D flip-flop or a D latch) LE 404 and LE 407 are inserted at the boundaries between SCK[1] 416 and SCK[2] 419 and between SCK[2] 419 and SCK[3] 424, respectively, in order to prevent crossing clock-domain timing problems. They can be selectively inserted at the boundaries between the multiplexer 402 and the scan chain SCN 409 and between the multiplexer 405 and the scan chain SCN 411, respectively.

FIG. 5 shows a scan connector of a second embodiment of the present invention to stitch multiple scan chains to one serial scan chain for diagnosing scan cores 208, logic BIST cores 210, or functional cores 211.

In FIG. 5(a), the serial scan chain SSC 501, formed in the way shown in FIG. 4, is placed before the boundary-scan chain BSC 502. The Select6 503 and Select7 504 signals should be generated so that the boundary-scan chain BSC 502, the combined scan chain composed of the serial scan chain SSC 501 and the boundary-scan chain BSC 502, or other registers can be properly placed between TDI 218 and TDO 219 according to various test and debug requirements.

In FIG. 5(b), the serial scan chain SSC 506, formed in the way shown in FIG. 4, is placed after the boundary-scan chain BSC 505. The Select8 507 signal should be generated so that the boundary-scan chain BSC 505, the combined scan chain composed of the boundary-scan chain BSC 505 and the serial scan chain SSC 506, or other registers can be properly placed between TDI 218 and TDO 219 according to various test and debug requirements.

FIG. 6 shows a scan connector 606 of a third embodiment of the present invention to stitch multiple scan chains SCN 607 to 610 to a plurality of grouped scan chains GSC 612 for diagnosing scan cores 208, logic BIST cores 210, or functional cores 211.

The scan chain SCN 607 is driven by the scan clock SCK[1] 614, the scan chains SCN 608 and 609 are in the same clock domain driven by the scan clock SCK[2] 617, and the scan chain SCN 610 is driven by the scan clock SCK[3] 622. With four multiplexers 602 to 605 in the scan connector 606, the four scan chains SCN 607 to 610 are stitched into three groups: the scan chain SCN 607 being in the first group, the scan chains SCN 608 and 609 being in the second group, and the scan chain SCN 610 being in the third group. The Select9 624 signal should be generated so that all scan chains SCN 607 to 610 get input data from TDI 218 in debug mode and from the external scan data inputs sys_SDI[1] 613, sys_SDI[2] 616, sys_SDI[3] 619, and sys_SDI[4] 621 in test mode. The Select10 625 signal should be generated so that the boundary-scan chain BSC 601, any of the grouped scan chains GSC 612, or other registers can be properly placed between TDI 218 and TDO 219 according to various test and debug requirements.

FIG. 7 shows a scan clock generator 302 of one embodiment of the present invention to generate scan clocks 244 for diagnosing scan cores 208.

FIG. 7(a) shows the scan clock generator 302, which is composed of a clock phase generator 701 and a scan clock controller 702. The clock phase generator 701 takes TCK as input and generates three non-overlapping clocks TCK1 706, TCK2 707, and TCK3 708, which have the same frequency as TCK. In addition to the non-overlapping TCK clock signals, the scan clock controller 702 has one more set of clock input signals: sys_CK[1] 703, sys_CK[2] 704, and sys_CK[3] 705, which are system clocks provided from the outside of the circuit under debug 212. The Select3 314 signal, generated based on the fault type and the power limit of the targeted scan cores 208, is used to select TCK 220, the non-overlapping TCK clocks 706 to 708, or the external system clocks 703 to 705 as scan clocks SCK[1] 709, SCK[2] 710, and SCK[3] 711 for the scan cores 208. The global scan enable signal GSE 243 is also generated by the scan clock controller 702.

FIG. 7(b) shows the waveforms for the scan clocks SCK[1] 709, SCK[2] 710, and SCK[3] 711, as well as the global scan enable signal GSE 243, when the Select3 314 signal represents the value of 0. It should be noted that, during the shift cycle, non-overlapping TCK clocks are used. As illustrated by pulses 733 to 735, this clocking scheme can reduce both peak power consumption and average power dissipation. During the capture cycle, clock-domain based signal-capture pulses 736 to 738 are applied at the frequency of TCK. This makes it possible to diagnose stuck-type faults, including stuck-at, bridging, or IDDQ faults.

FIG. 7(c) shows the waveforms for the scan clocks SCK[1] 709, SCK[2] 710, and SCK[3] 711, as well as the global scan enable signal GSE 243, when the Select3 314 signal represents the value of 1. It should be noted that, during the shift cycle, non-overlapping TCK clocks are used. As illustrated by pulses 741 to 743, this clocking scheme can reduce both peak power consumption and average power dissipation. During the capture cycle, clock-domain based double-capture pulses <744, 745>, <746, 747>, and <748, 749>, are applied at the system clock frequencies. This makes it possible to diagnose non-stuck-type delay faults, including transition (gate-delay), path-delay, memory read/write, or multiple-cycle delay faults.

FIG. 7(d) shows the waveforms for the scan clocks SCK[1] 709, SCK[2] 710, and SCK[3] 711, as well as the global scan enable signal GSE 243, when the Select3 314 signal represents the value of 2. During the shift cycle, overlapping TCK clocks are used. It should be noted that these overlapping TCK clocks are only used when a serial scan chain is deployed. As illustrated by pulses 763 to 765, this clocking scheme can reduce the shift time. During the capture cycle, clock-domain based single-capture pulses 766 to 768 are applied at the frequency of TCK. This makes it possible to diagnose stuck-type faults, including stuck-at, bridging, or IDDQ faults.

FIG. 7(e) shows the waveforms for the scan clocks SCK[1] 709, SCK[2] 710, and SCK[3] 711, as well as the global scan enable signal GSE 243, when the Select3 314 signal represents the value of 3. During the shift cycle, overlapping TCK clocks are used. It should be noted that these overlapping TCK clocks are only used when a serial scan chain is deployed. As illustrated by pulses 771 to 773, this clocking scheme can reduce the shift time. During the capture cycle, clock-domain based double-capture pulses <774, 775>, <776, 777>, and <778, 779>, are applied at the system clock frequencies. This makes it possible to diagnose non-stuck-type delay faults, including transition (gate-delay), path-delay, memory read/write, or multiple-cycle delay faults.

Figure 8:
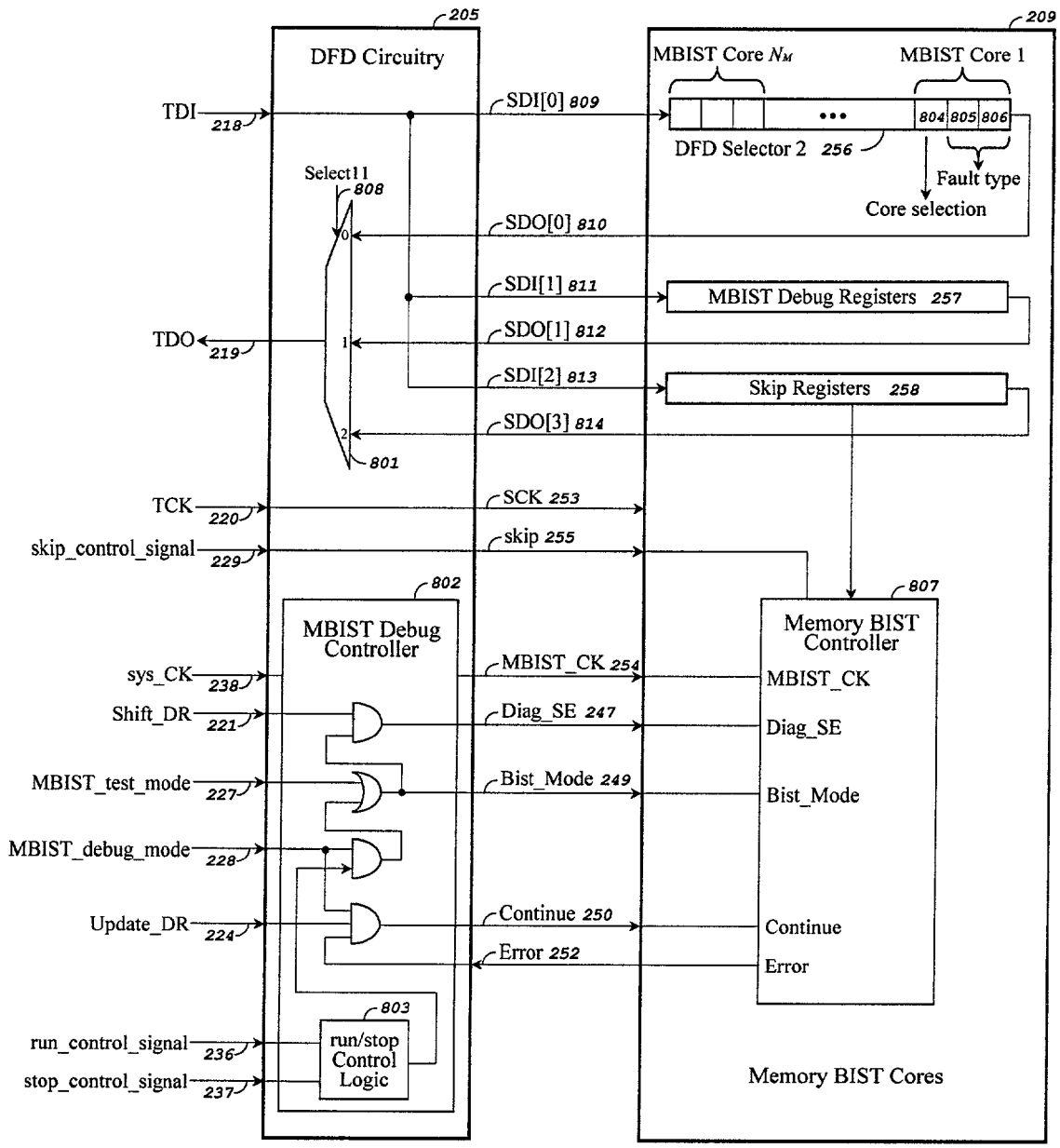
FIG. 8 shows a DFD circuitry of one embodiment of the present invention to debug or diagnose memory BIST cores.

FIG. 8 shows a DFD circuitry 205 of one embodiment of the present invention to debug or diagnose memory BIST cores 209.

In the memory BIST cores 209, DFD Selector 2 is a shift register 256 of which 2 or more bits are assigned to each memory BIST core to indicate whether the memory BIST core will be diagnosed and what type of faults, including those faults requiring at-speed test or those faults requiring slow-speed test, shall be targeted. For example, for the first memory BIST core MBIST Core 1, the bit 804 indicates if this core will be diagnosed while the bits 805 and 806 indicate what type of faults should be targeted.

In addition, there are MBIST debug registers 257, one for each memory BIST core. A MBIST debug register is used to store such selected data as the selected MBIST finish signal, memory address, error memory index, output data, error signal, status codes, and other selected registers and signals in one of the memory BIST cores 209.

Furthermore, there are skip registers 258, one for each memory BIST core. A skip register is used for storing a predetermined number of MBIST clock cycles or errors to be skipped during the process of debugging one of the memory BIST cores 209.

DFD Selector 2 256, MBIST debug registers 257, and skip registers 258 are all connected to a multiplexer 801. If the Select11 808 signal is properly generated, the DFT Selector 2 256, the MBIST debug registers 257, or the skip registers 258 can be placed between TDI 218 and TDO 219 according to various test and debug requirements. The DFD Selector 2 256, MBIST debug registers 257, and skip registers 258 are controlled by TCK 215.

The DFD Circuitry 205 also contains a MBIST debug controller 802, which generates all necessary debug control signals for the Memory BIST Controller 807.

When the BIST mode 249 is set to logic value 1, the memory BIST controller 807 within a selected memory BIST core 209 will start its memory BIST operation immediately. This is done by setting the MBIST test mode 227 to logic value 1 or both MBIST debug mode 228 and run control signal 236 to logic value 1. The MBIST test mode 227 is set to logic value 1 when a conventional RUN_MBIST command is issued.

The BIST mode 249 will stay at logic value 1 through the course of the memory BIST operation. During this period, depending on various test and debug requirements, a diagnosis scan enable signal Diag_SE 247 is generated by Shift_DR 221 from the TAP controller 202 for controlling the shift and capture operations of the MBIST debug registers 257, skip registers 258, and DFD selector 2 256. The memory BIST operation is stopped when a stop control signal 237 is issued.

Whenever a memory BIST operation in the memory BIST controller 807 detects an error, after a predetermined skip condition is met, the memory BIST controller 807 in the selected memory BIST core 209 will output an error signal 252, halt the BIST operation, and begin to wait for a continue signal 250 to resume its memory BIST operation and reset the error signal 252.

While the memory BIST controller is performing the memory BIST operation, the selected data is captured (or sampled) periodically into the MBIST debug register 257 and shifted out for diagnosis. After shifting the selected data out for diagnosis, the TAP controller 202 via the memory BIST DFD circuitry 205 will issue the continue signal 250 (a clock pulse through Update_DR 224) to resume the memory BIST operation and reset the error signal 252 to logic value 0. The capture and shift operations are repeated periodically until memory BIST diagnosis is done.

Figure 9:
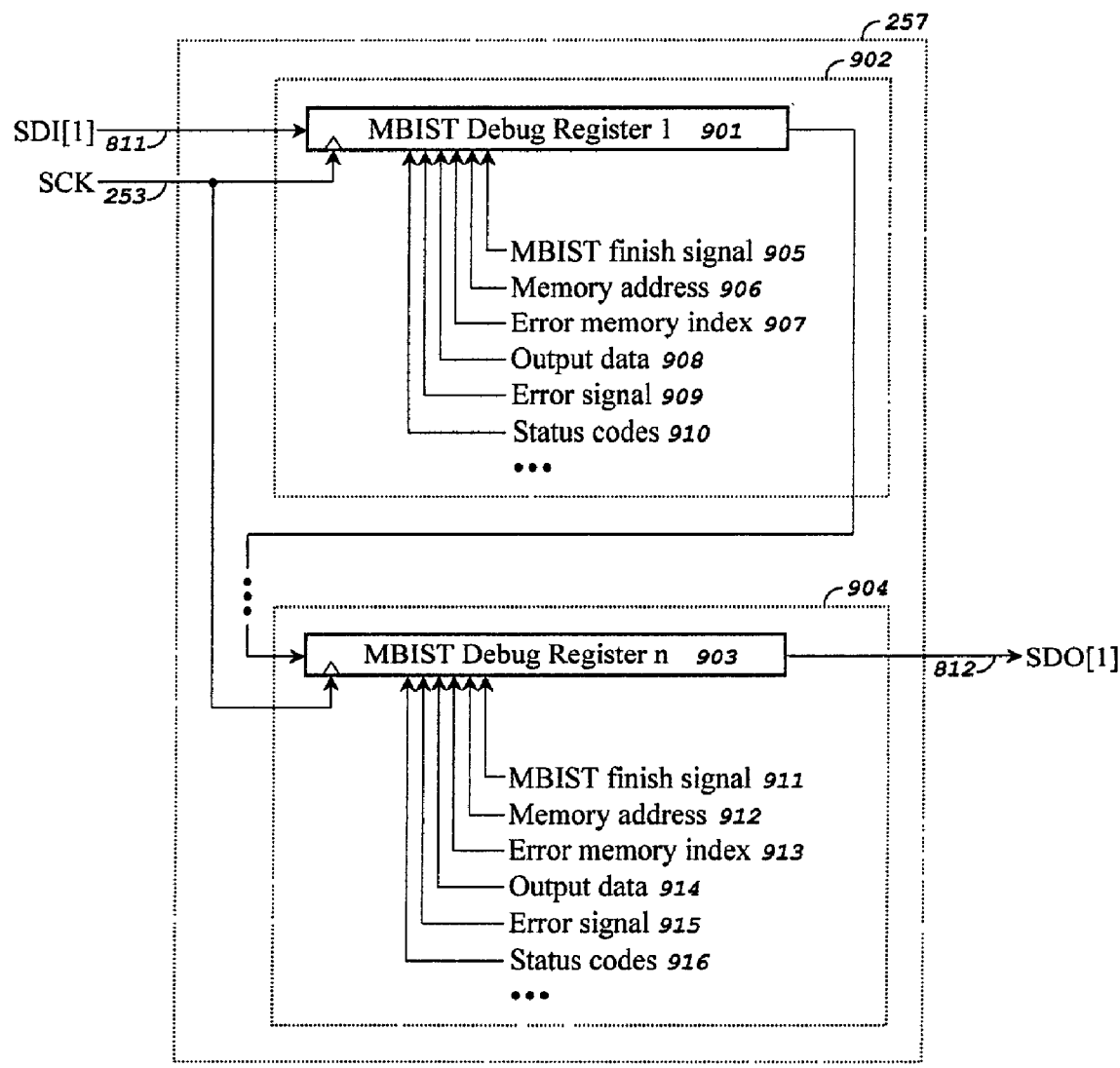
FIG. 9 shows a MBIST debug register of one embodiment of the present invention to store selected MBIST data for diagnosing memory BIST cores.

FIG. 9 shows MBIST debug registers 257 of one embodiment of the present invention to store selected MBIST data for diagnosing memory BIST cores 209. The MBIST debug registers 257, driven by the scan clock SCK 253 operating at the frequency of TCK 220, include MBIST Debug Register 1 901 to MBIST Debug Register n 903, each such memory BIST debug register corresponding to one memory BIST core. For example, MBIST Debug Register 1 901 stores the MBIST finish signal 905, memory address 906, error memory index 907, output data 908, error signal 909, status codes 910, and other selected registers and signals in the corresponding memory BIST core.

Figure 10:
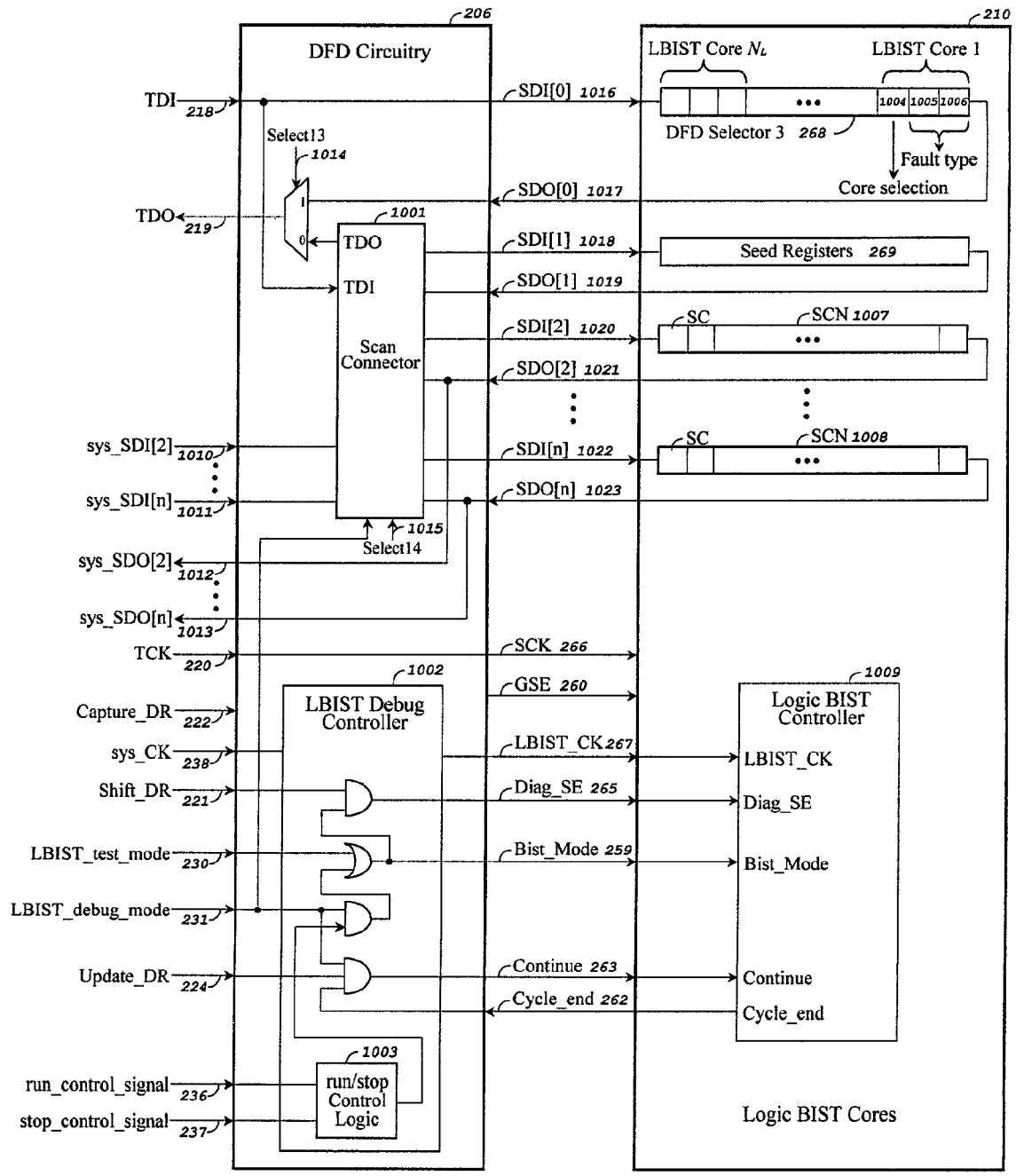
FIG. 10 shows a DFD circuitry of one embodiment of the present invention to debug or diagnose logic BIST cores.

FIG. 10 shows a DFD circuitry 206 of one embodiment of the present invention to debug or diagnose logic BIST cores 210.

In the logic BIST cores 210, the DFD Selector 3 is a shift register 268 of which 2 or more bits are assigned to each LBIST core to indicate whether the LBIST core will be diagnosed and what type of faults, including stuck-at, bridging, IDDQ, transition (gate-delay), path-delay, or multiple-cycle delay faults, shall be targeted. For example, for the first logic BIST core LBIST Core 1, the bit 1004 indicates if this core will be diagnosed while the bits 1005 and 1006 indicate what type of faults should be targeted.

In addition, each selected logic BIST core contains one seed register 269, which can be reconfigured from existing registers, including the pseudorandom pattern generator (PRPG) and the multiple-input signature register (MISR), or be formed by additional registers used to store such selected data as the LBIST finish signal, PRPG outputs, cycle counter outputs, MISR outputs, cycle-end signal, scan-chain mask, cycle-mask start index, cycle-mask stop index, and other selected registers and signals. This information is indispensable in the process of debugging logic BIST cores 210.

Furthermore, all scan cells SC within all logic BIST cores 210 should be put into scan chains SCN 1007 to 1008, which are then stitched by a scan connector 1001 into either one serial scan chain SSC or multiple grouped scan chains GSC. As a result, if the Select13 1014 and Select14 1015 signals are properly generated, DFT Selector 3 268, seed registers 269, one serial scan chain SSC, or any of grouped scan chains can be placed between TDI 218 and TDO 219 according to various test and debug requirements.

The DFD Circuitry 206 also contains a LBIST debug controller 1002, which generates all necessary debug control signals for the Logic BIST Controller 1009.

When the BIST mode 259 is set to logic value 1, the logic BIST controller 1009 within a selected logic BIST core 210 will start its logic BIST operation immediately. This is done when the LBIST test mode 230 is set to logic value 1 or both LBIST debug mode 231 and run control signal 236 are set to logic value 1. The LBIST test mode 230 is set to logic value 1 when a conventional RUN_LBIST command is issued.

The BIST mode 259 will stay at logic value 1 through the course of the logic BIST operation. During this period, depending on various test and debug requirements, a diagnosis scan enable signal Diag_SE 265 is generated by Shift_DR 221 from the TAP controller 202 for controlling the shift and capture operations of the seed registers 269, and the DFD selector 3 268. The logic BIST operation is stopped when a stop control signal 237 is issued.

Whenever a logic BIST operation in the logic BIST controller 1009 completes one or more selected LBIST clock cycles, the logic BIST controller 1009 in the selected logic BIST core 210 will output a cycle-end signal 262, halt the BIST operation, and begin to wait for a continue signal 263 to resume its logic BIST operation and to reset the cycle-end signal 262. The selected data is captured (or sampled) periodically into a seed register 269 and shifted out for diagnosis. After shifting the selected data out for diagnosis, the TAP controller 202 via the logic BIST DFD circuitry 206 will issue the continue signal 263 (a clock pulse through Update_DR 224) to resume the logic BIST operation and reset the cycle end signal 262 to logic value 0. The capture and shift operations are repeated periodically until logic BIST diagnosis is done.

It should be noted that the shift operation on the seed registers 269 are only allowed after the cycle-end signal 262 is at logic value 1. One must issue the SHIFT command very carefully in order not to confuse the logic BIST operation with the shift operation.

Figure 11:
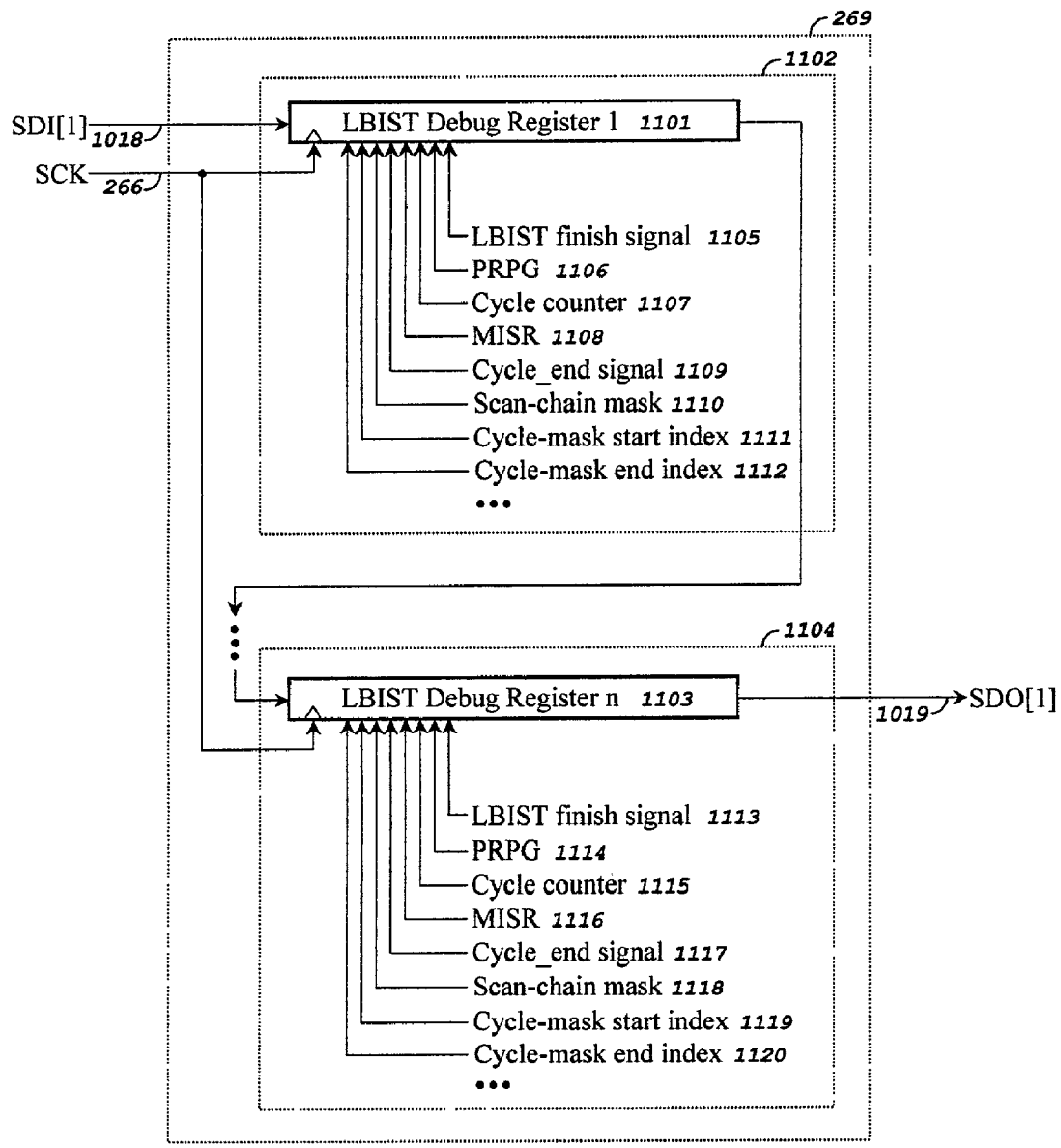
FIG. 11 shows a plurality of seed registers of a first embodiment of the present invention to store selected LBIST data for diagnosing logic BIST cores.

In addition, each seed register 269 can be constructed using a separate register or reconfigured from existing data registers or signals. FIG. 11 will show an example of using a separate LBIST debug register as a seed register 269, while FIG. 12 will show another example of reconfiguring a selected set of data registers and signals as a seed register 269. One major difference between these two approaches is that if a separate LBIST debug register is used, its clock will be connected to TCK 220 directly. There won't be any need to switch the clock of the seed register between TCK 220 controlling the shift operation and the LBIST clock 267 controlling the logic BIST operation, as in the other case.

FIG. 11 shows a plurality of seed registers 269 of a first embodiment of the present invention to store selected LBIST data for diagnosing logic BIST cores 210. The seed registers 269, driven by the scan clock SCK 266 operating at the frequency of TCK 220, include LBIST Debug Register 1 1101 to LBIST Debug Register n 1103, each logic BIST debug register corresponding to one logic BIST core. For example, LBIST Debug Register 1 1101 is used to store the LBIST finish signal 1105, pseudorandom pattern generator (PRPG) outputs 1106, cycle counter outputs 1107, multiple-input signature register (MISR) outputs 1108, cycle-end signal 1109, scan-chain mask 1110, cycle-mask start index 1111, cycle-mask stop index 1112, and other selected registers and signals in the selected logic BIST core.

Figure 12:
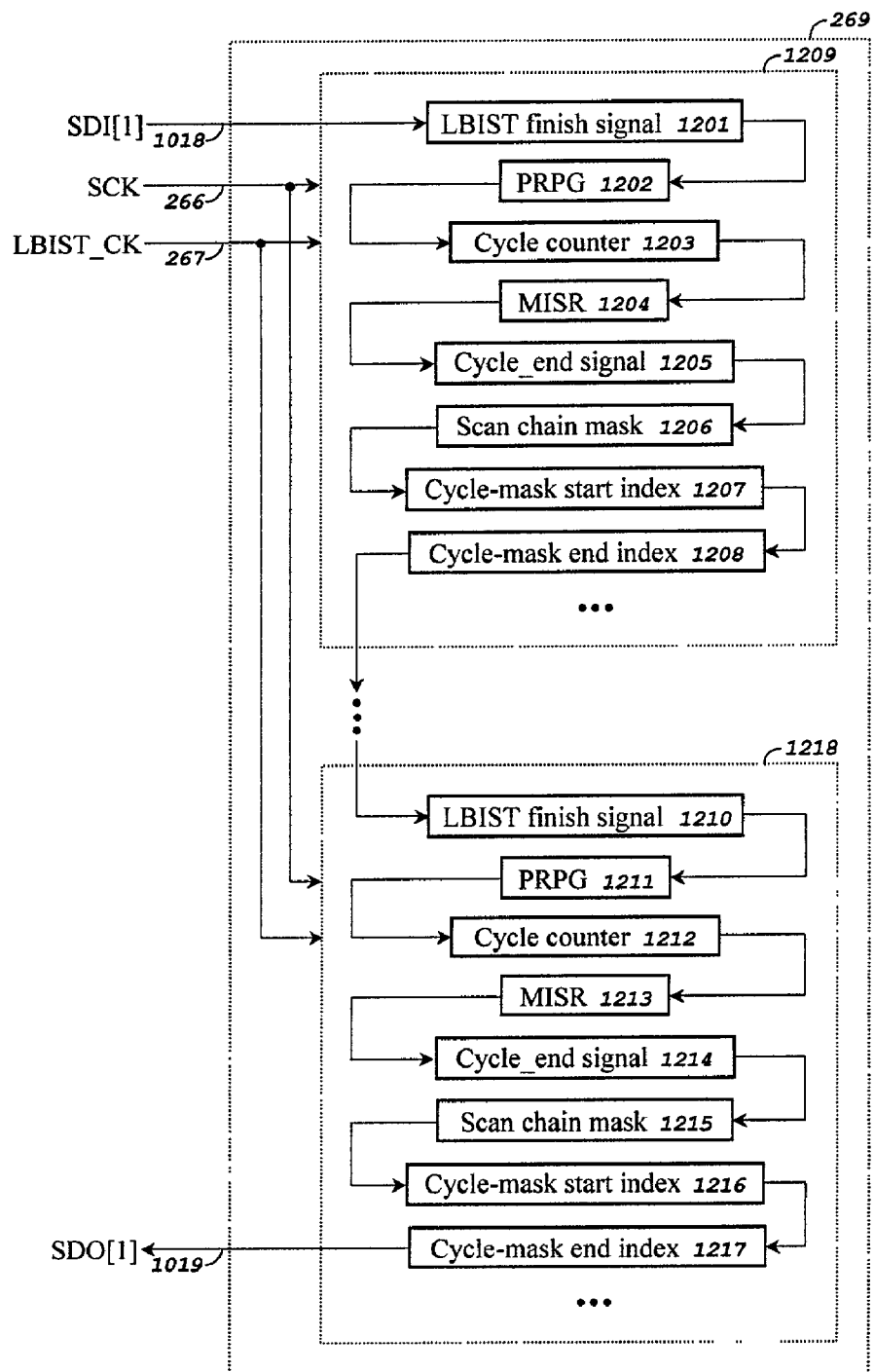
FIG. 12 shows a plurality of seed registers of a second embodiment of the present invention to store selected LBIST data for diagnosing logic BIST cores.

FIG. 12 shows a plurality of seed registers 269 of a second embodiment of the present invention to store selected LBIST data for diagnosing logic BIST cores 210. In each selected logic BIST core, a seed register is constructed by reconfiguring a subset of existing data registers and signals into a shift register. For example, the LBIST finish signal register 1201, the pseudorandom pattern generator (PRPG) 1202, the cycle counter 1203, the multiple-input signature register (MISR) 1204, the cycle-end signal register 1205, the scan-chain mask register 1206, the cycle-mask start index register 1207, the cycle-mask stop index register 1208, and other selected registers and signals in the selected logic BIST core are reconfigured into a seed register for the first logic BIST core 1209. Such individual seed registers are further stitched together into one single scan chain so that it can be accessed through boundary-scan. The seed registers 269 are driven by the scan clock SCK 266 during the debug shift operation and by the logic BIST clock LBIST_CK 267 during the logic BIST operation.

Figure 13:
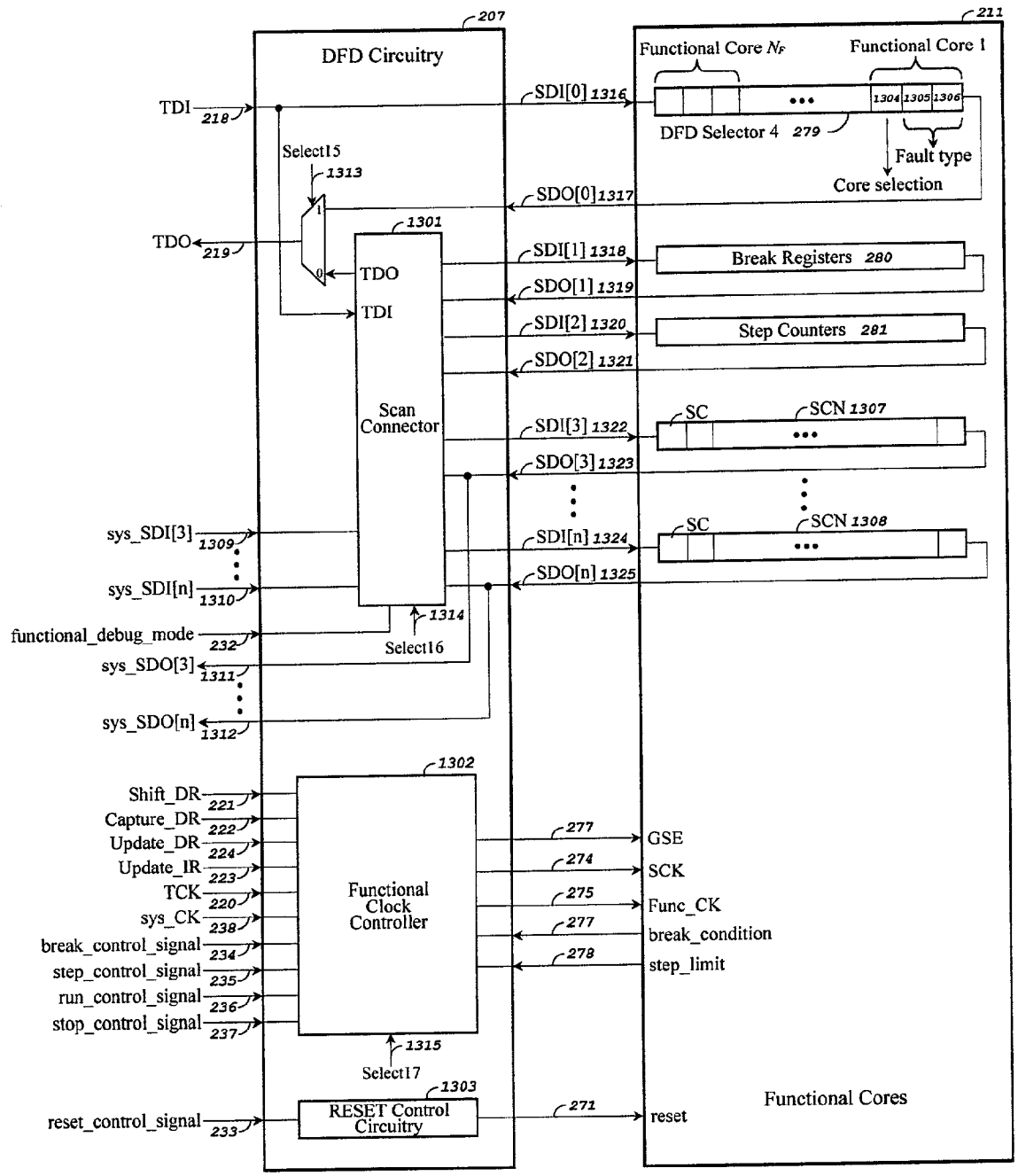
FIG. 13 shows a DFD circuitry of one embodiment of the present invention to debug or diagnose functional cores.

FIG. 13 shows a DFD circuitry 207 of one embodiment of the present invention to debug or diagnose functional cores 211.

In the functional cores 211, DFD Selector 4 is a shift register 279 of which 2 or more bits are assigned to each functional core to indicate whether the functional core will be diagnosed and what type of faults, including stuck-at, bridging, IDDQ, transition (gate-delay), path-delay, memory read/write, or multiple-cycle delay faults, shall be targeted. For example, for the first functional core Functional Core 1, the bit 1304 indicates if this core will be diagnosed while the bits 1305 and 1306 indicate what type of faults should be targeted.

In addition, each selected functional core can contain a plurality of break registers 280 for storing predetermined break conditions. It also contains a step counter 281 for storing a predetermined cycle count.

Furthermore, all scan cells SC within all functional cores 211 should be put into scan chains SCN 1307 to 1308, which can be then stitched together by a scan connector 1301 as one serial scan chain or multiple grouped scan chains. As a result, if the Select15 1313 and Select16 1314 signals are properly generated, DFT Selector 4 279, the break registers 280, the step counters 281, one serial scan chain or any of grouped scan chains can be placed between TDI 218 and TDO 219 according to various test and debug requirements.

Figure 19:
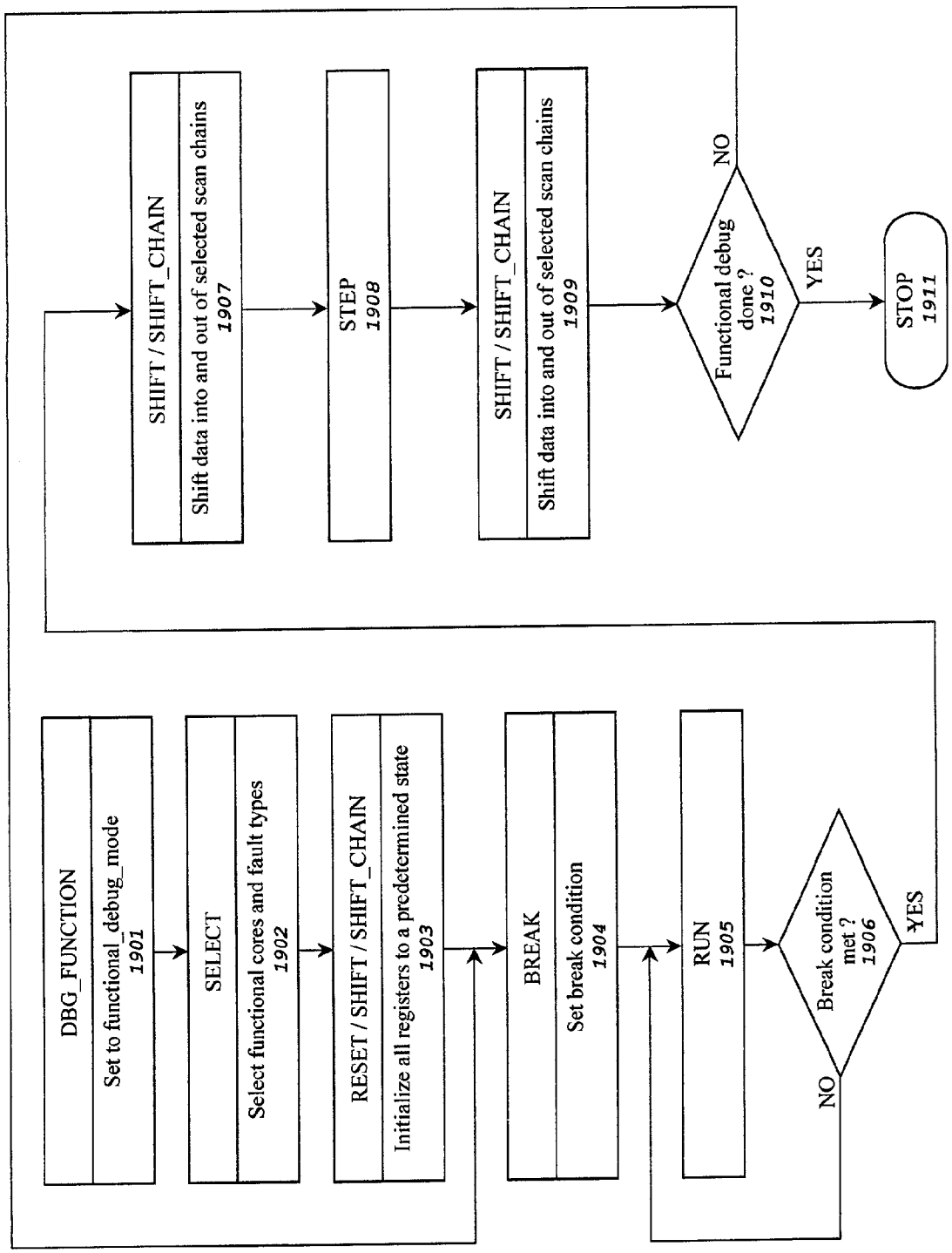
FIG. 19 shows a flow chart of selected DFD commands of one embodiment of the present invention to debug or diagnose functional cores.

The DFD Circuitry 207 also contains a functional clock controller 1302 and a RESET control circuitry 1303, which generate all necessary debug control signals for functional cores 211. The functional core debug control flow is shown in FIG. 19.

Figure 14:
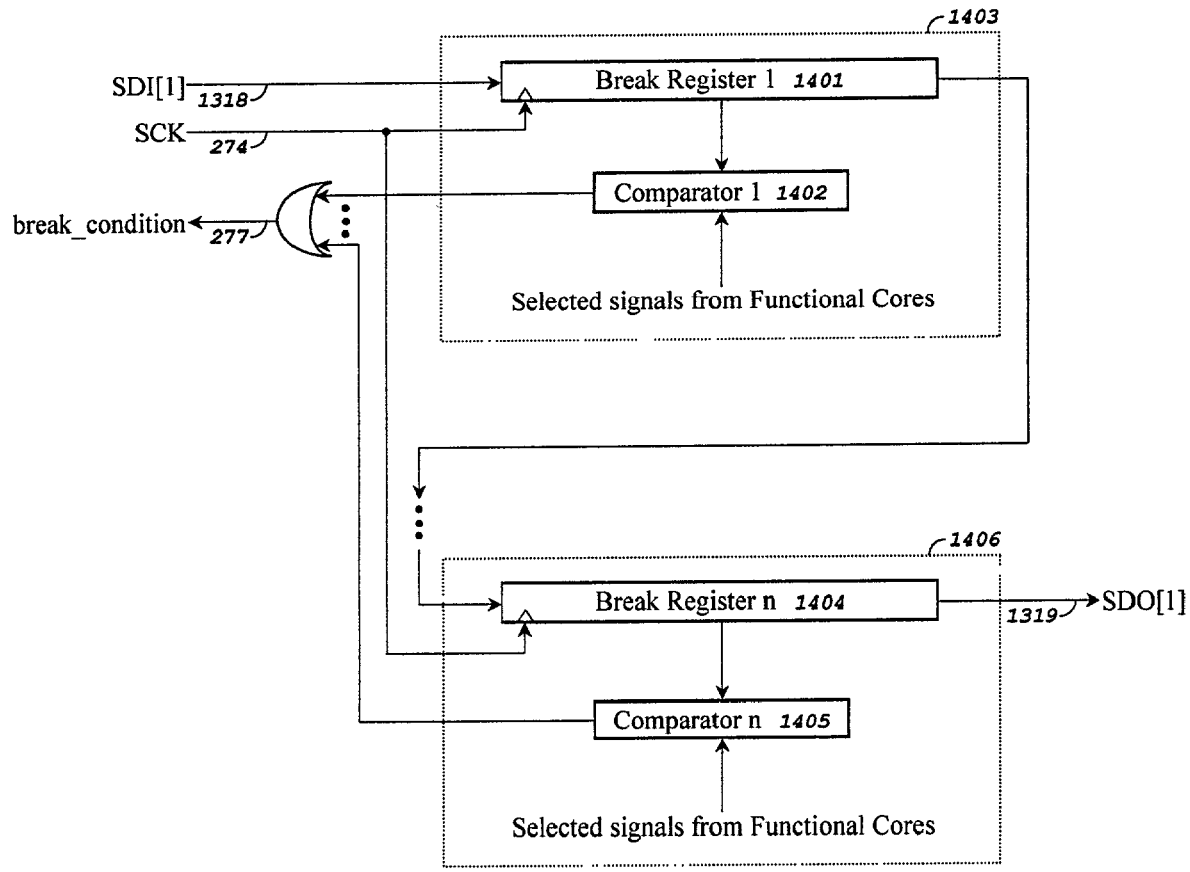
FIG. 14 shows a break control circuitry of one embodiment of the present invention to generate control signals for diagnosing functional cores.

FIG. 14 shows a BREAK control circuitry 1400 of one embodiment of the present invention to generate control signals for diagnosing functional cores 211.

All break registers 1401 to 1404 are driven by the same scan clock SCK 274 operating at the frequency of TCK 220. Each functional core can contain a plurality of break registers, each break register representing one break condition. Each break register 1401 or 1404 stores a required break condition. Its outputs are connected to a comparator 1402 and are compared with selected signals in the selected functional core. If the selected signals represent a condition that is indicated by the break register 1401 or 1404, a break_condition signal 277 will become logic value 1.

Figure 15:
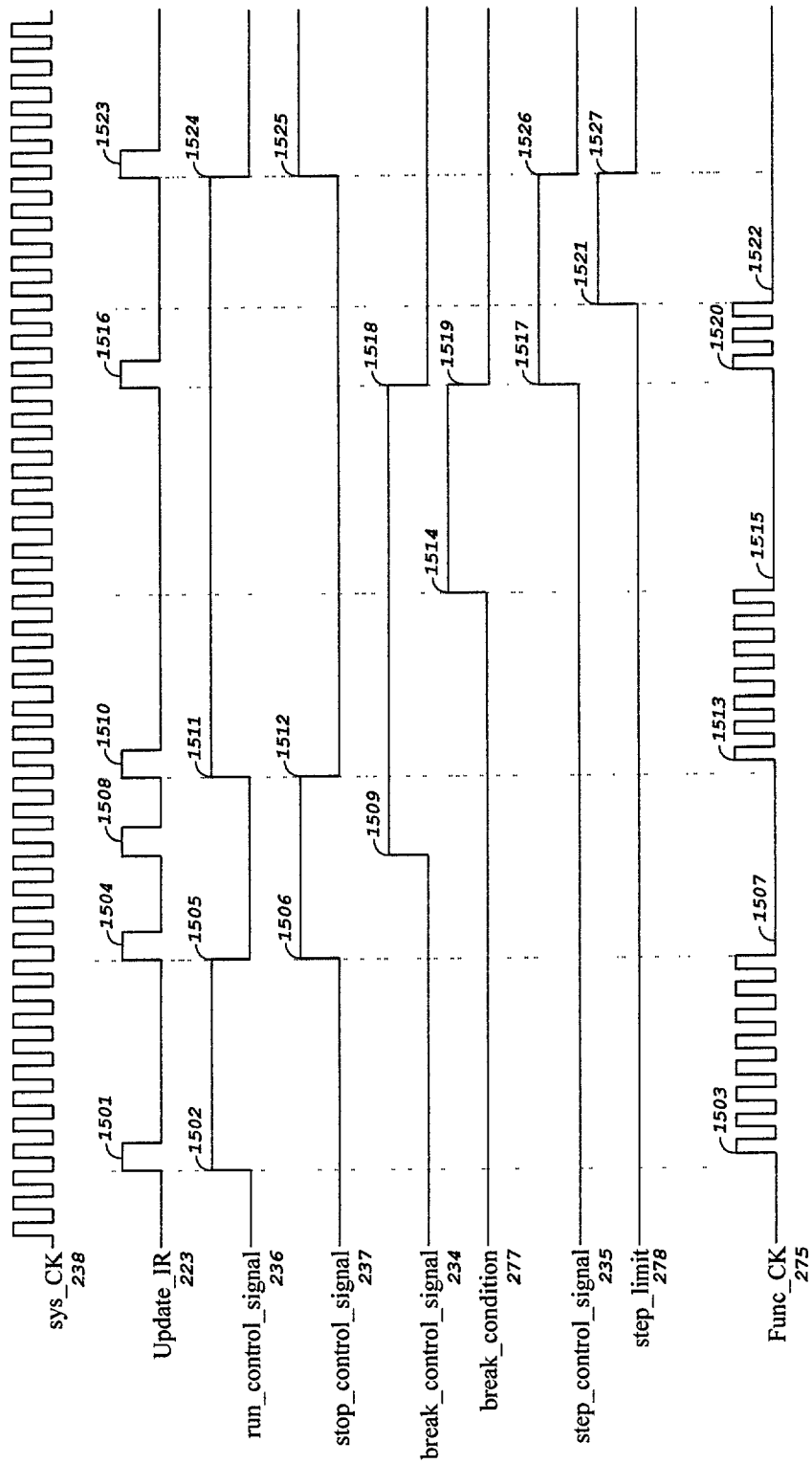
FIG. 15 shows a timing diagram of the functional clock controller of one embodiment of the present invention to debug or diagnose functional cores.

FIG. 15 shows a timing diagram 1500 of the functional clock controller 1302 of one embodiment of the present invention to debug or diagnose functional cores 211.

When a RUN command is issued, the Update_IR pulse 1501 will change the run_control_signal 236 to logic value 1 as shown by 1502. As a result, the functional clock func_CK 275 will start to run as shown by 1503. Then, if a STOP command is issued, the Update_IR pulse 1504 will change the stop_control_signal 237 to logic value 1 as shown by 1506 and the run_control_signal 236 to logic value 0 as shown by 1505. As a result, the functional clock func_CK 275 will stop running as shown by 1507.

Now suppose that a BREAK command is issued, the Update_IR pulse 1508 will change the break_control_signal 234 to logic value 1 as shown by 1509. This will enable the break condition comparison. Then, when a RUN command is issued, the Update_IR pulse 1510 will change the run_control_signal 236 to logic value 1 as shown by 1511 and the stop_control_signal 237 to logic value 0 as shown by 1512. As a result, the functional clock func_CK 275 will start to run as shown by 1513. If the break condition is met, the break_condition signal 277 will become logic value 1 as shown by 1514. This will stop the functional clock func_CK 275 immediately as shown by 1515.

Now suppose that a STEP command is issued, the Update_IR pulse 1516 will change the step_control_signal 235 to logic value 1 as shown by 1517. This will enable the step counter to start counting down. At the same time, the functional clock func_CK 275 will start to run as shown by 1520. In addition, the break_control_signal 234 and the break_condition signal 277 will become logic value 0 as shown by 1518 and 1519, respectively. When the step counter becomes zero, the step_limit signal 278 will become logic value 1 as shown by 1521. This will stop the functional clock func_CK 275 immediately as shown by 1522.

Figure 16:
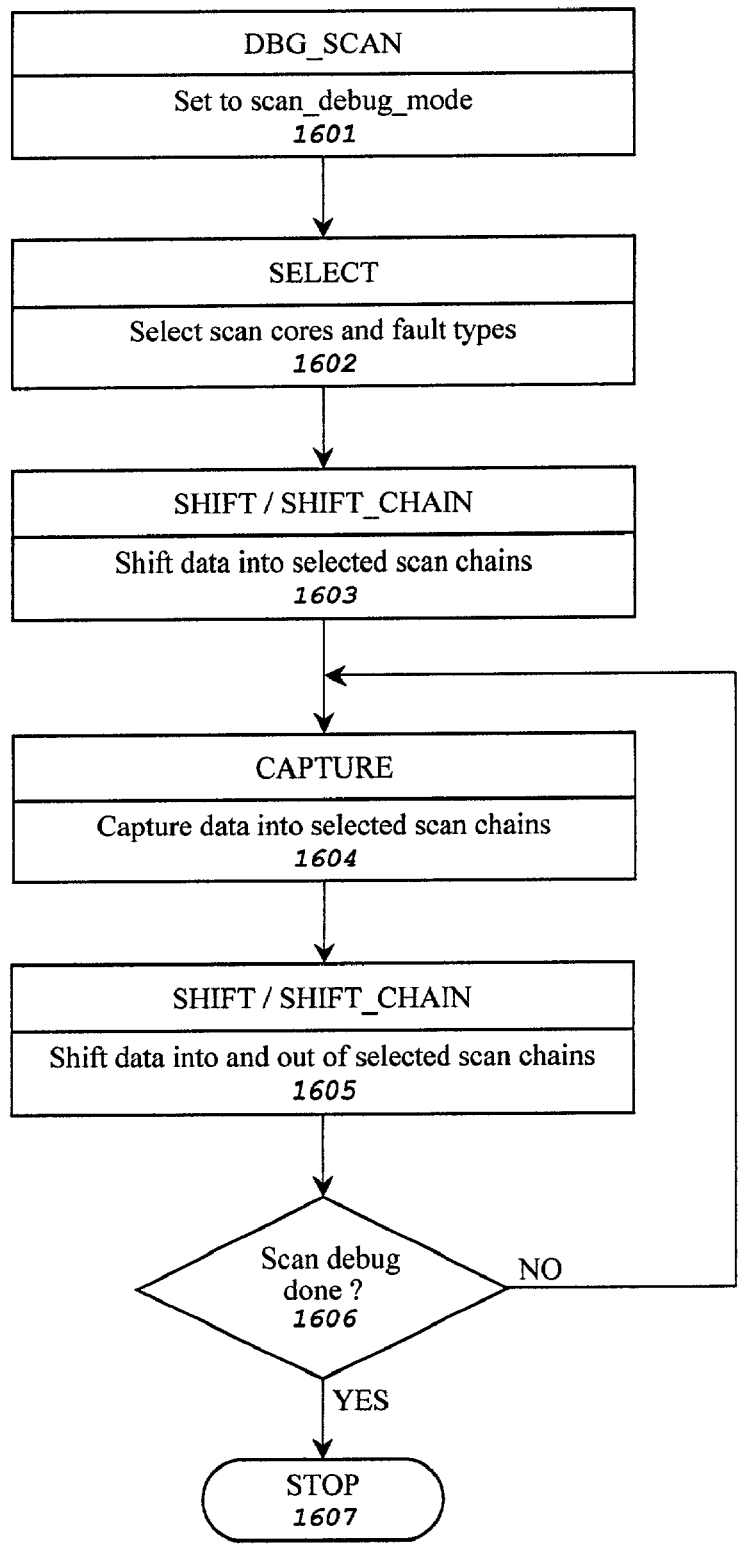
FIG. 16 shows a flow chart of selected DFD commands of one embodiment of the present invention to debug or diagnose scan cores.

FIG. 16 shows a flow chart 1600 of selected DFD commands of one embodiment of the present invention to debug or diagnose scan cores 208.

For scan diagnosis, a boundary-scan controlled command of the present invention, DBG_SCAN, is first issued in the stage of 1601 to set the scan_debug_mode signal 226 to logic value 1, indicating the start of the process of debugging scan cores 208. Then, a basic command, SELECT, is used in the stage of 1602 to choose what type of faults and which scan cores are to be debugged or diagnosed. After that, a first SHIFT command or a first plurality of SHIFT_CHAIN commands are issued in the stage of 1603 to shift scan patterns into selected scan chains. Then, a CAPTURE command is issued to capture output response into selected scan chains in the stage of 1604. After that, a second SHIFT command or a second plurality of SHIFT_CHAIN commands will be issued to shift out the output response and shift in a new scan pattern in the stage of 1605. This process is repeated between stages 1604 and 1605 until scan diagnosis is done. By that time, one can simply issue a STOP command in the stage of 1607.

Figure 17:
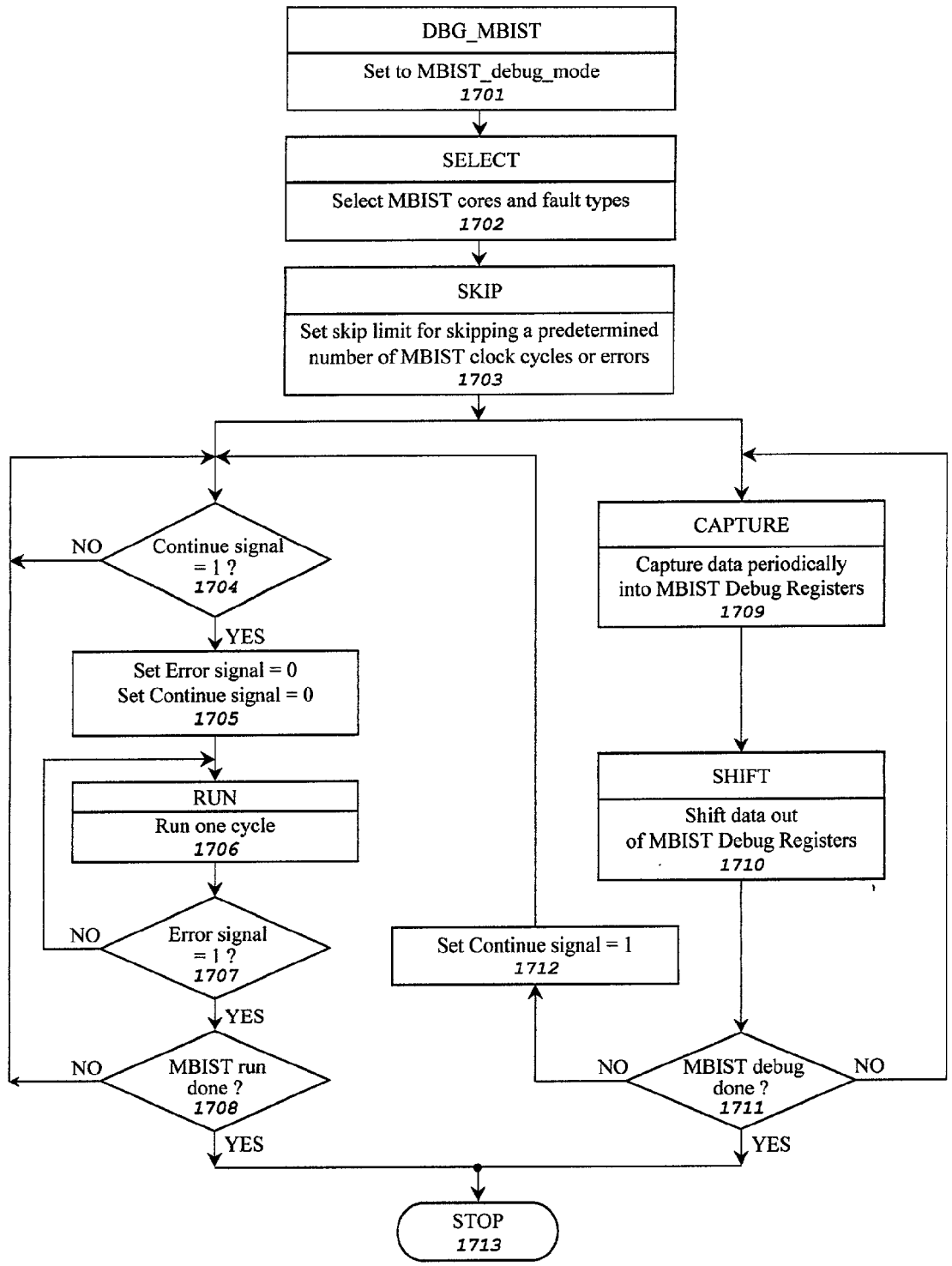
FIG. 17 shows a flow chart of selected DFD commands of one embodiment of the present invention to debug or diagnose memory BIST cores.

FIG. 17 shows a flow chart 1700 of selected DFD commands of one embodiment of the present invention to debug or diagnose memory BIST cores 209.

For memory BIST diagnosis, a boundary-scan controlled command of the present invention, DBG_MBIST, is first issued in the stage of 1701 to set the MBIST_debug_mode signal 228 to logic value 1, indicating the start of the process of debugging memory BIST cores 209. Then, a basic command, SELECT, is used in the stage of 1702 to choose what type of faults and which memory BIST cores, including SRAM or DRAM cores, are to be debugged or diagnosed. After that, a basic command, SKIP, is used in the stage of 1703 to shift into each skip register 258 a predetermined number of MBIST clock cycles or errors to be skipped during the process of debugging a memory BIST core 209.

When a memory BIST debug process is started, two concurrent control flows will be initiated: one being a memory BIST operation flow as shown on the left-hand side 1704 to 1708 of FIG. 17, the other being a memory BIST sampling flow as shown on the right-hand side 1709 to 1711 of FIG. 17. Both Error signal 252 and Continue signal 250 are set to an initial state of logic value 0 and 1 in the stage of 1701, respectively.

The memory BIST operation flow 1704 to 1707 continues until the first memory BIST error, after the skip condition is met, is found. If this happens, the memory BIST operation is halted immediately and the Error signal 252 is set to logic value 1 in the stage of 1706. If the MBIST run in the stage of 1708 is not finished, it will wait for a Continue signal 250 in the stage of 1704 to resume the memory BIST operation. This will happen only when the memory BIST sampling flow 1709 to 1711 further sets the Continue signal 250 to logic value 1 in the stage of 1712.

The memory BIST sampling flow 1709 to 1711 keeps using the CAPTURE command in the stage of 1709 to capture or sample selected MBIST data, including memory address and data, into the MBIST debug registers 257 and the SHIFT command in the stage of 1710 to shift out its contents for diagnosis. After the SHIFT command is processed and if the memory BIST debug is not finished, the Continue signal 250 in the stage of 1712 will be set to 1. This will start the memory BIST operation flow 1704 to 1708 again and it will keep running until the next error, after the skip condition is met, is encountered. The whole process continues until memory BIST debug is done. By that time, one can simply issue a STOP command in the stage of 1713 for generating a stop control signal 237 to stop the memory BIST operation.

Figure 18:
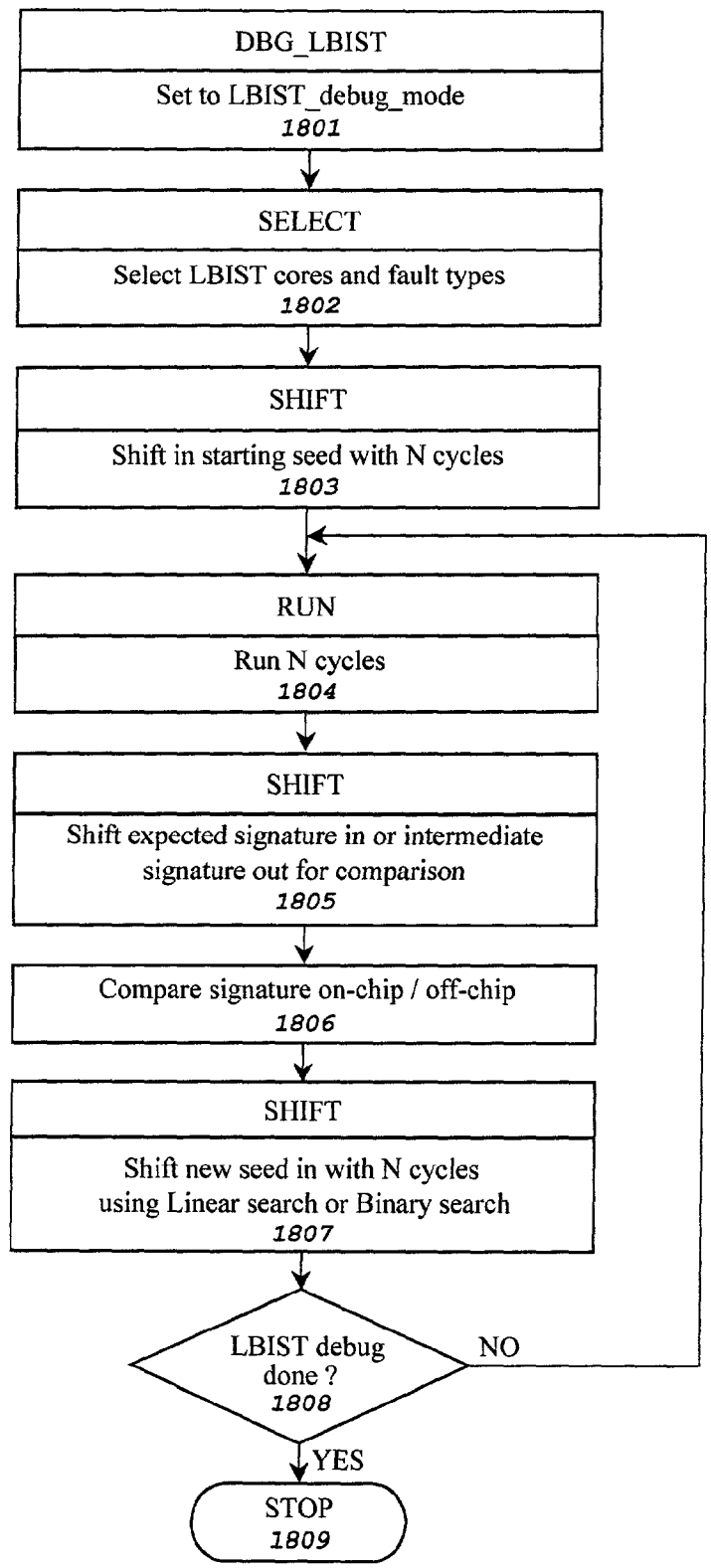
FIG. 18 shows a flow chart of selected DFD commands of one embodiment of the present invention to debug or diagnose logic BIST cores.

FIG. 18 shows a flow chart 1800 of selected DFD commands of one embodiment of the present invention to debug or diagnose logic BIST cores 210.

For logic BIST diagnosis, a boundary-scan controlled command of the present invention, DBG_LBIST, is first issued in the stage of 1801 to set the LBIST_debug_mode signal 231 to logic value 1, indicating the start of the process of debugging logic BIST cores 210. Then, a basic command, SELECT, is used in the stage of 1802 to choose what type of faults and which logic BIST cores, including DSP or CPU cores, are to be debugged or diagnosed. In the stage of 1803, a first SHIFT command is issued for shifting in a predetermined seed with N cycles to a seed register 269 in each said selected logic BIST core 210.

Then, in the stage of 1804, a RUN command is issued. The logic BIST operation will continue until N logic BIST cycles are completed. At that time, the logic BIST operation is halted immediately. The selected data, including the intermediate signature, in the seed register 269 is then compared on-chip or shifted out for comparison. A second SHIFT command is issued in the stage of 1805 for shifting in the expected signature for on-chip comparison or shifting out the intermediate signature for off-chip comparison over a predetermined sampling period. Depending on whether a signature error is found during comparison in the stage of 1806, a third SHIFT command is further issued in the stage of 1807 to pick and shift in a new seed with N logic BIST cycles to the seed register 269 using a linear search or binary search method.

This process from 1804 to 1808 is repeated until logic BIST diagnosis is done. By that time, one can issue a STOP command in the stage of 1809 for generating a stop control signal 237 to stop the logic BIST operation.

The use of seed registers makes it possible to restore the internal circuit status for any cycle. Based on this, various search methods can be used to locate a signature error. Suppose that a signature error is found after running 1000 logic BIST cycles. The linear search method and the binary search method are briefly illustrated in the following:

In order to locate all failing cycles that generate signature errors, one can use the linear search method in which the process of running for one cycle, checking for any signature error, restoring the internal circuit status is repeated until a signature error is found. In the worst case, this method requires 1000 signature checks for locating all single and multiple signature errors. In order to speed up this process, one can divide the 1000 cycles into 10 groups, each containing 100 cycles. Then, one first runs logic BIST from cycle 1 to cycle 100, from cycle 101 to cycle 200, . . . , from cycle 901 to cycle 1000, and then checks the 10 signatures obtained at the $100^{th}$ cycle, $200^{th}$ cycle, . . . , and $1000^{th}$ cycle. Suppose that there are only two signature errors found at the $300^{th}$ cycle and $700^{th}$ cycle. In this case, one can then use this linear search method cycle by cycle to locate all single and multiple signature errors from cycle 201 to cycle 300 and from cycle 601 to cycle 700. In this case, the number of signature checks is 210 rather than 1000.

In order to locate the first cycle that generates a signature error, one can also use the binary search method in which the process of running logic BIST for half of the suspected cycles is repeated until a signature error is found. Initially, the suspected range is from cycle 1 to cycle 1000. One can run logic BIST from cycle 1 to cycle 500. If a signature error is found, then one runs logic BIST from cycle 1 to cycle 250. If no signature error is found at the $250^{th}$ cycle, then one runs logic BIST from cycle 251 to cycle 375, and check for any signature error again. In this case, a total of 10 signature checks will be needed.

It should be noted that depending on the error signature behavior, one can selectively using a hybrid linear search or binary search method to further reduce signature checks.

FIG. 19 shows a flow chart 1900 of selected DFD commands of one embodiment of the present invention to debug or diagnose functional cores 211.

For functional diagnosis, a boundary-scan controlled command of the present invention, DBG_FUNCTION, is first issued in the stage of 1901 to set the functional_debug_mode signal 232 to logic value 1, indicating the start of the process of debugging functional cores 210. Then in the stage of 1902, a basic command, SELECT, is used to choose what type of faults and which functional cores, including memories or IO cores, are to be debugged or diagnosed. The DFD circuitry of the present invention further comprises a few basic commands: RESET, BREAK, RUN, SHIFT/SHIFT_CHAIN, STEP, and STOP.

The RESET command initializes the functional cores 211 to a predetermined state in the stage of 1903. One can also use a SHIFT command or a plurality of SHIFT_CHAIN commands to perform the initialization in the stage of 1903. This will make the initialization process more flexible.

The BREAK command issued in the stage of 1904 allows the designer to specify and stop the circuit's operation when the break <condition> is met. The designer can then issue a RUN command in the stage of 1905 to run the system clocks forever. The break <condition> is checked in the stage of 1906. If it is met, the functional cores are stopped and the designer can then issue a first SHIFT command or a first plurality of SHIFT_CHAIN commands in the stage of 1907 for shifting out the contents of the scan cells SC in the functional cores 211 for diagnosis. Then, the designer can issue a STEP command in the stage of 1908 to run the functional cores 211 for one or more system clock cycles. When the circuit stops, the designer can issue a second SHIFT command or a second plurality of SHIFT_CHAIN commands in the stage of 1909 for shifting out the contents of the scan cells SC in the functional cores 211 for diagnosis.

The process continues until functional diagnosis is done. By that time, one can simply issue a STOP command in the stage of 1911. It should be noted that a second STOP command can be issued at any time after the RUN command is issued in the stage of 1905. This will make sure that the circuit can be stopped even when none of the specified break conditions are met. At that time, the designer can further specify a number of BREAK commands in the stage of 1904 and issue a second RUN command in the stage of 1905 again.

It should be noted that, in order to obtain complete debug information at a failed functional cycle, it is necessary to use the SHIFT command twice. For example, suppose that a functional core fails at the $100^{th}$ cycle. In order to obtain the input values to internal logic blocks at the $100^{th}$ cycle, it is necessary to use the first SHIFT command to shift out the contents of all scan cells at the $99^{th}$ cycle. Then, when the $100^{th}$ cycle comes, the second SHIFT command should be used again to shift out the contents of all scan cells so as to obtain the output responses of the internal logic blocks.

Figure 20:
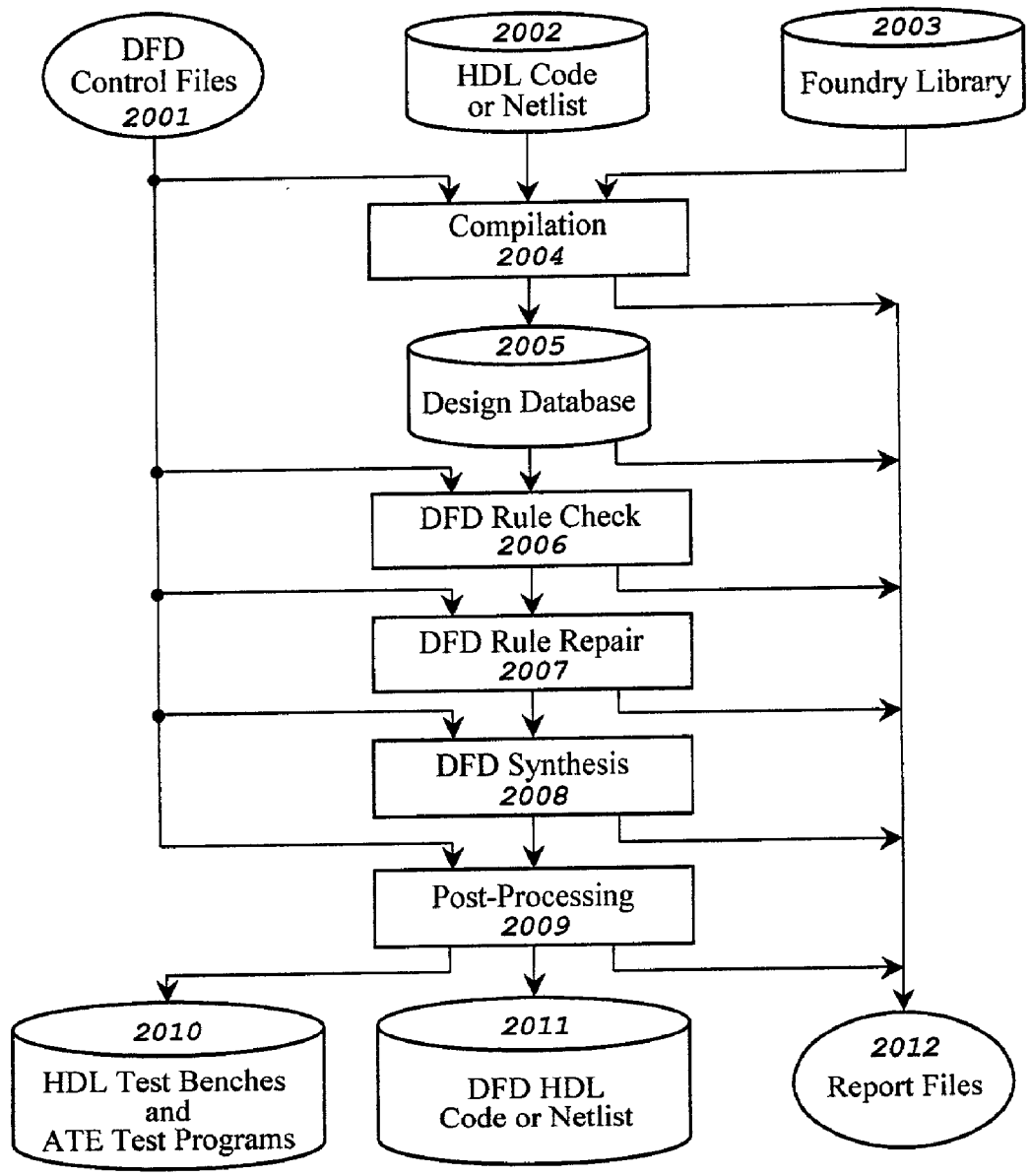
FIG. 20 shows a computer-aided design (CAD) method in accordance with the present invention to synthesize the DFD controller and DFD circuitries.

FIG. 20 shows a computer-aided design (CAD) method 2000 in accordance with the present invention to synthesize the DFD controller 203 and DFD circuitries 204 to 207. The computer-aided design (CAD) method accepts the user-supplied HDL (hardware description language) code or netlist 2002 together with the DFD control files 2001 and the chosen foundry library 2003. The DFD control files 2001 contain all set-up information and scripts required for compilation 2004, DFD rule check 2006, DFD rule repair 2007, DFD synthesis 2008, and post-processing 2009, so that the CAD method 2000 can produce the final DFD HDL code or netlist 2011 and the HDL test benches and ATE (automatic test equipment) test programs 2010. The HDL test benches and ATE test programs 2010 can further comprise test programs for use in a low-cost DFT debugger 201. All reports and errors are saved in the report files 2012.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. An apparatus for inserting a DFD (design-for-debug) circuitry in an integrated circuit to debug or diagnose selected fault types in scan cores, the integrated circuit containing two or more said scan cores each having a scan clock; said apparatus comprising:
   (a) a DFD selector for indicating which said scan cores and said selected fault types will be debugged or diagnosed simultaneously;

(b) a scan connector for connecting multiple scan chains in said scan cores to a boundary-scan chain in said integrated circuit;

(c) a scan clock generator for generating an ordered sequence of capture clocks for connection to said scan clocks in said scan cores; and (d) a multiplexer for connecting said DFD selector and said scan connector to a TAP (test access port) controller in said integrated circuit.

2. The apparatus of claim 1, further comprising a scan debug mode; wherein said scan debug mode is set to logic value 1 when said scan cores are to be diagnosed, and set to logic value 0 when said scan cores are not to be diagnosed.

3. The apparatus of claim 2, wherein said scan debug mode is generated by a central DFD controller; wherein said central DFD controller interfaces with said TAP controller and said DFD circuitry; and wherein said TAP controller is constructed according to a selected Boundary-scan Standard which includes a test access port (TAP) comprising TDI (test data in), TDO (test data out), TCK (test clock), TMS (test mode select), and selectively TRSTB (test reset).

4. The apparatus of claim 3, wherein said DFD selector further comprises using a shift register of 2 or more bits in each said scan core to indicate whether said scan core will be diagnosed and what said selected fault type shall be targeted; wherein said shift register is controlled by said TCK and its scan data input and scan data output are connected to said TDI and said TDO via said multiplexer, respectively.

5. The apparatus of claim 3, wherein said scan connector further comprises using a plurality of multiplexers to stitch said multiple scan chains together as one serial scan chain and connect its scan data input and scan data output to said TDI and said TDO, respectively; wherein said multiplexers are controlled by said scan debug mode.

6. The apparatus of claim 3, wherein said scan connector further comprises using a plurality of multiplexers to stitch said multiple scan chains together as one serial scan chain and insert said serial scan chain before or after said boundary-scan chain; wherein said multiplexers are controlled by said scan debug mode.

7. The apparatus of claim 3, wherein said scan connector further comprises using a plurality of multiplexers to stitch only those scan cells within all said multiple scan chains which share the same said scan clock together as one single scan chain, called grouped scan chain; wherein said grouped scan chain connects its scan data input and scan data output to said TDI and said TDO, respectively; and wherein said multiplexers are controlled by said scan debug mode.

8. The apparatus of claim 3, wherein said scan clock generator for generating an ordered sequence of capture clocks further comprises a clock phase generator and a scan clock controller.

9. The apparatus of claim 8, wherein said clock phase generator is controlled by said TCK and generates a plurality of non-overlapping TCK clocks; and wherein said scan clock controller is controlled by said selected fault type and connects said capture clocks, comprising said TCK, said non-overlapping TCK clocks, and non-overlapping system clocks, to said scan clocks in said scan cores; wherein said non-overlapping system clocks are generated by the system clocks external to said integrated circuit or on an ATE (automatic test equipment).

10. The apparatus of claim 9, wherein said non-overlapping TCK clocks are used to debug or diagnose said stuck-type faults, including said stuck-at faults, said bridging faults, and said IDDQ faults, in said scan cores in said integrated circuit.

11. The apparatus of claim 9, wherein said non-overlapping system clocks are used to debug or diagnose said non-overlapping stuck-type delay faults, including said transition (gate-delay) faults, said path-delay faults, said memory read/write faults, and said multiple-cycle delay faults, in said scan cores in said integrated circuit.

12. The apparatus of claim 9, wherein said scan clock controller further comprises a generator for generating a global scan enable (GSE) signal to control the shift and capture operations of said multiple scan chains in said scan cores; wherein said generator for generating a global scan enable (GSE) signal is further generated by said TAP controller, including $Shift_{13}$ DR, $Capture_{13}$ DR, and $Update_{13}$ DR, according to said selected Boundary-scan Standard.

13. The apparatus of claim 1, wherein said faults chosen by said selected fault types further comprise stuck-type faults and non-stuck-type delay faults; wherein said stuck-type faults include stuck-at faults, bridging faults, and IDDQ (IDD quiescent current) faults; and wherein said non-stuck-type delay faults include transition (gate-delay) faults, path-delay faults, memory read/write faults, and multiple-cycle delay faults.

14. The apparatus of claim 1, wherein said scan connector further comprises selectively inserting an inverter and a lock-up element between any two said multiple scan chains when stitched together to form a serial scan chain or a grouped scan chain; wherein said lock-up element is a selected D latch or D flip-flop.

15. The apparatus of claim 1, wherein said DFD circuitry is further selected for debugging or diagnosing memory scan cores.

16. A method for debugging or diagnosing selected fault types in scan cores using an embedded DFD (design-for-debug) circuitry in an integrated circuit, the integrated circuit containing two or more said scan cores each having a scan clock; said method comprising the steps of:

(a) issuing a $DBG_{13}$ SCAN command for generating a scan debug mode to control said DFD circuitry in said scan cores;

(b) issuing a SELECT command for shifting in selected scan cores and said selected fault types to be debugged or diagnosed to the DFD selector of said DFD circuitry in said scan cores;

(c) issuing a first SHIFT command or a first plurality of $SHIFT_{13}CHAIN$ commands for shifting in a predetermined scan pattern to all scan cells within selected scan chains in said scan cores for diagnosis;

(d) issuing one or more CAPTURE commands for capturing output responses into all said scan cells in said scan cores;

(e) issuing a second SHIFT command or a second plurality of $SHIFT_{13}$ CHAIN commands for shifting a new predetermined scan pattern into and output response out of all said scan cells within said selected scan chains in said scan cores for diagnosis; pg,48

(f) repeating steps of (d)–(e) until scan diagnosis is done; and (g) issuing a STOP command for generating a stop control signal to stop the scan operation.

17. The method of claim 16, further comprising providing a central DFD controller for accepting said commands and generating said scan debug mode and said stop control signal to control said DFD circuitry; wherein said DFD controller interfaces with said DFD circuitry and a TAP (test access port) controller in said integrated circuit; and wherein said TAP controller is constructed according to a selected Boundary-scan Standard.

18. The method of claim 16, wherein said faults chosen by said selected fault type in said selected scan core for debug or diagnosis further comprise selectively stuck-type faults or non-stuck-type delay faults; wherein said stuck-type faults include stuck-at faults, bridging faults, and IDDQ faults; and wherein said non-stuck-type delay faults include transition (gate-delay) faults, path-delay faults, memory read/write faults, and multiple-cycle delay faults.

19. The method of claim 16, wherein said commands are further used to debug or diagnose memory scan cores.

* * * * *